(12) United States Patent
Jang et al.

(10) Patent No.: US 9,917,174 B2
(45) Date of Patent: Mar. 13, 2018

(54) SEMICONDUCTOR DEVICES AND METHODS OF MANUFACTURING THE SAME

(71) Applicant: SAMSUNG ELECTRONICS CO., LTD., Suwon-si, Gyeonggi-Do (KR)

(72) Inventors: Sung-Uk Jang, Hwaseong-si (KR); Gi-Gwan Park, Hwaseong-si (KR); Ho-Sung Son, Hwaseong-si (KR); Dong-Suk Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/442,871

(22) Filed: Feb. 27, 2017

(65) Prior Publication Data

US 2017/0271476 A1    Sep. 21, 2017

(30) Foreign Application Priority Data

Mar. 18, 2016  (KR) .......................... 10-2016-0032566

(51) Int. Cl.
*H01L 29/66* (2006.01)
*H01L 21/265* (2006.01)
*H01L 29/78* (2006.01)

(52) U.S. Cl.
CPC ...... *H01L 29/66545* (2013.01); *H01L 21/265* (2013.01); *H01L 29/6656* (2013.01); *H01L 29/66795* (2013.01); *H01L 29/785* (2013.01)

(58) Field of Classification Search
CPC ............. H01L 29/66545; H01L 29/785; H01L 29/66795; H01L 21/265; H01L 29/6656
See application file for complete search history.

(56) References Cited

U.S. PATENT DOCUMENTS

| | | | |
|---|---|---|---|
| 7,521,720 B2 | 4/2009 | Mathew et al. | |
| 7,687,361 B2 | 3/2010 | Jang et al. | |
| 8,829,617 B2 | 9/2014 | Haran et al. | |
| 8,901,667 B2 | 12/2014 | Jagannathan et al. | |
| 2012/0098141 A1 | 4/2012 | Kim et al. | |
| 2014/0162435 A1 | 6/2014 | Waite et al. | |
| 2015/0194528 A1 | 7/2015 | Okano | |
| 2015/0206965 A1 | 7/2015 | Cheng et al. | |
| 2015/0348966 A1* | 12/2015 | Zhao .................. | H01L 27/0886 257/401 |

* cited by examiner

*Primary Examiner* — Kyoung Lee
(74) *Attorney, Agent, or Firm* — Volentine & Whitt, PLLC

(57) ABSTRACT

In a method of manufacturing a semiconductor device, an isolation pattern may be formed on a substrate to define a plurality of active patterns. The active patterns may protrude from the isolation pattern. A preliminary polysilicon layer may be formed on the active patterns to fill a gap between adjacent ones of the active patterns. Ions having no conductivity may be implanted into the preliminary polysilicon layer to form a polysilicon layer having no void. The active patterns maintain their crystalline state during the implanting of the ions. The polysilicon layer may be patterned to form a dummy gate structure on the active pattern. A source/drain region may be formed at an upper portion of the active patterns adjacent to sides of the dummy gate structure.

20 Claims, 43 Drawing Sheets

FIG. 7
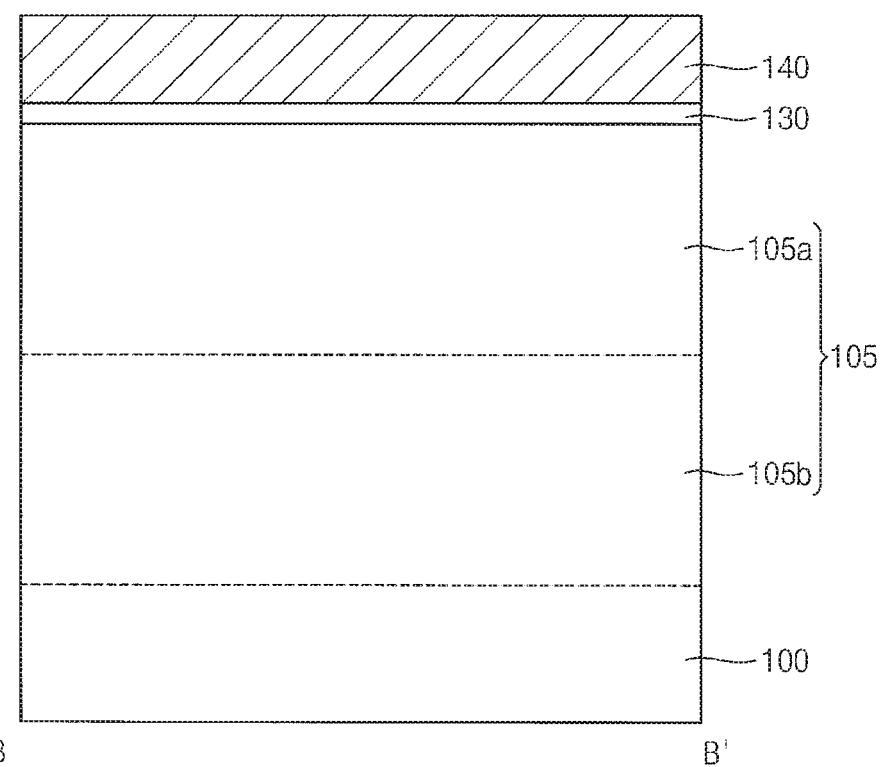
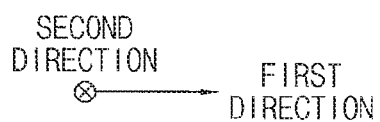

FIG. 15
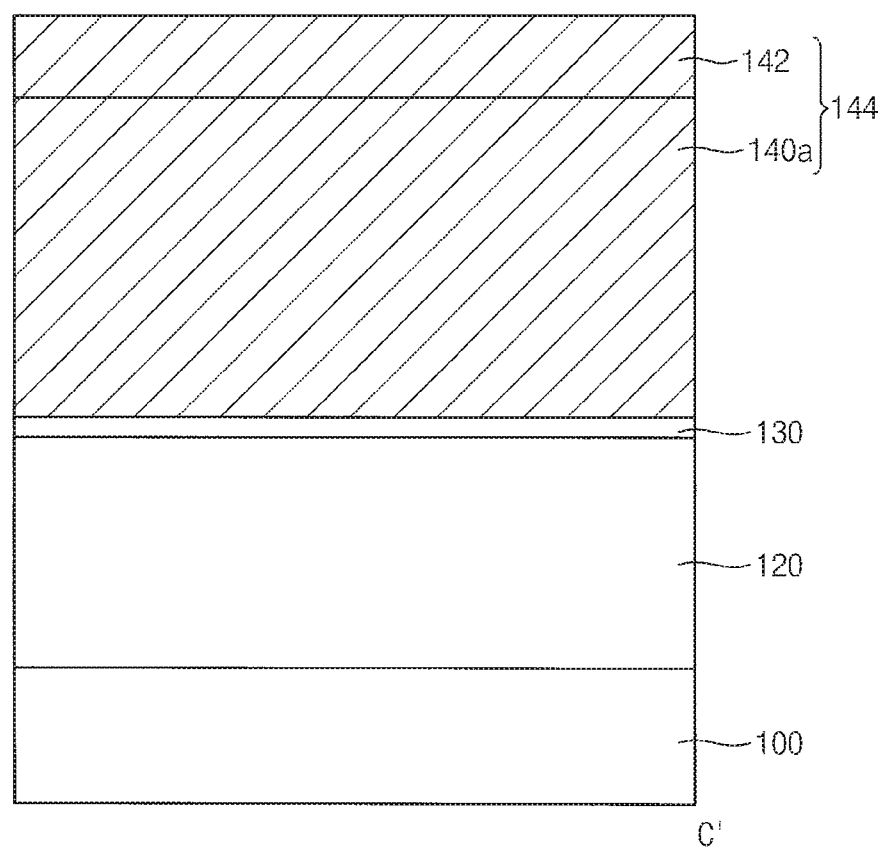
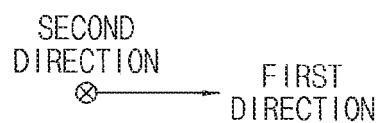

FIG. 38
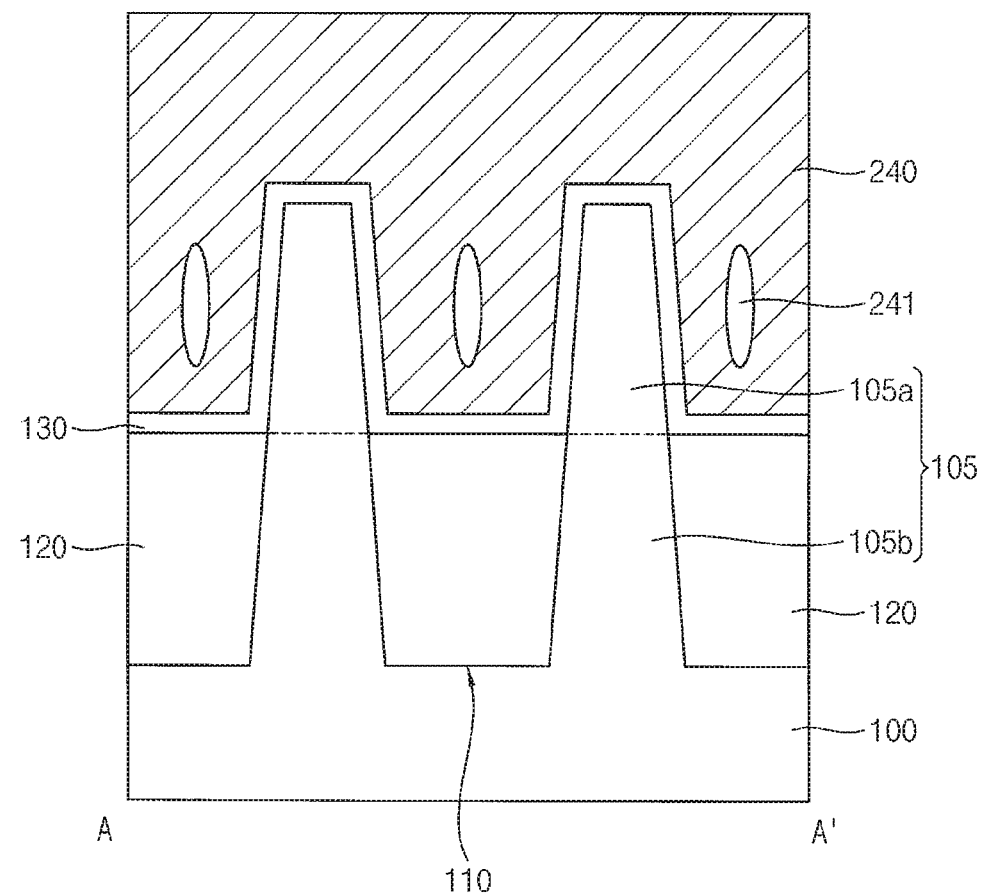

SEMICONDUCTOR DEVICES AND METHODS OF MANUFACTURING THE SAME

PRIORITY STATEMENT

This application claims priority under 35 USC § 119 to Korean Patent Application No. 10-2016-0032566, filed on Mar. 18, 2016 in the Korean Intellectual Property Office (KIPO), the contents of which are hereby incorporated by reference in their entirety.

BACKGROUND

1. Field

The inventive concept relates to semiconductor devices and methods of manufacturing the same. More particularly, the inventive concept relates to semiconductor devices including transistors having active regions spaced from each other, such as fin-type field effect transistors (finFETs), and to methods of manufacturing the same.

2. Description of the Related Art

Recently, semiconductor devices including fin-type field effect transistors (finFET) have been developed. In a semiconductor device including finFETs, the active regions of the transistors are formed by fins of semiconductor material extending parallel to one another.

SUMMARY

According to the inventive concept, there is provided a method of manufacturing a semiconductor device which includes: forming an isolation pattern on a substrate to define a plurality of active patterns of crystalline material protruding from the isolation pattern and spaced from one another such that a gap exists between adjacent ones of the active patterns, forming a preliminary polysilicon layer on the active patterns to fill the gap, ion implanting using ions electrically neutral dopants, the dopants implanting into the preliminary polysilicon layer to form a polysilicon layer having no void therein, wherein the active patterns maintain the crystalline state thereof during the ion implanting, patterning the polysilicon layer to form a dummy gate structure on the active patterns, and forming a source/drain region at upper portions of the active patterns adjacent to sides of the dummy gate structure.

According to the inventive concept, there is also provided a method of manufacturing a semiconductor device which includes: forming active patterns of crystalline material each extending longitudinally in a first direction and spaced apart from each other in a second direction such that a gap is defined by and between respective ones of the active patterns adjacent to each other in the second direction, depositing polysilicon on the active patterns conformally until the polysilicon within the gap has an upper surface situated above the level of upper surfaces of the active regions, implanting an electrically neutral dopant into the polysilicon to form a consolidated layer comprising polysilicon and under such conditions that the active patterns maintain the crystalline state thereof during the implanting of the dopant, forming a gate extending across the active patterns, wherein the forming of the gate includes patterning the polysilicon layer, and forming a source/drain region at upper portions of the active patterns.

BRIEF DESCRIPTION OF THE DRAWINGS

The inventive concept will be more clearly understood from the following detailed description taken in conjunction with the accompanying drawings. FIGS. 1 to 43 represent non-limiting, examples of the inventive concept as described herein.

FIGS. 1 to 36 illustrate stages of examples of a method of manufacturing a semiconductor device in accordance with the inventive concept, with FIGS. 1, 3, 5, 9, 12, 16, 19, 20, 26 and 33 being plan views of the device during the course of its manufacture, FIGS. 2, 4, 6-8, 10-11, 13-15, 17-19, 21-25, 27, 29-32 and 34-36 being cross-sectional views of the device taken along lines A-A' of corresponding ones of the plan views, FIGS. 7, 14, 18, 21, 23-25, 28, 31 and 35 being cross-sectional views taken along lines B-B' of corresponding ones of the plan views, and FIGS. 8, 11, 15, 19, 22, 29, 32 and 36 being cross-sectional views taken along lines C-C' of corresponding ones of the plan views; and FIGS. 37 to 43 illustrate examples of stages of a method of manufacturing a semiconductor device in accordance with the inventive concept, with FIG. 37 being a plan view of the device during the course of its manufacture, FIGS. 38 and 41 being cross-sectional views taken along line A-A' of FIG. 37, FIGS. 39 and 42 being cross-sectional views taken along line B-B' of FIG. 37, respectively, and FIGS. 40 and 43 being cross-sectional views taken along line C-C' of FIG. 37.

DETAILED DESCRIPTION

Examples of a method of manufacturing a semiconductor device in accordance with the inventive concept will now be described in detail with reference to FIGS. 1 to 36.

Figure 1:
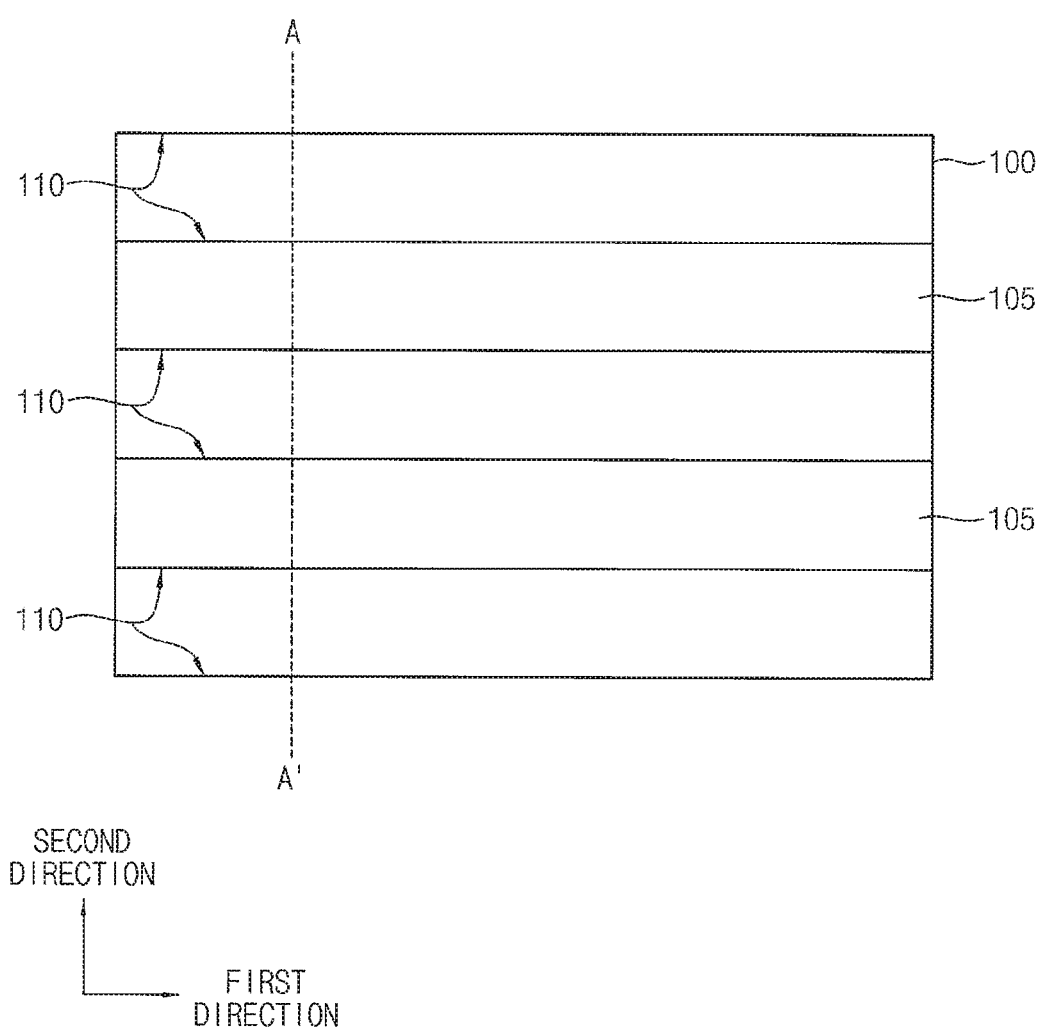
Figure 2:
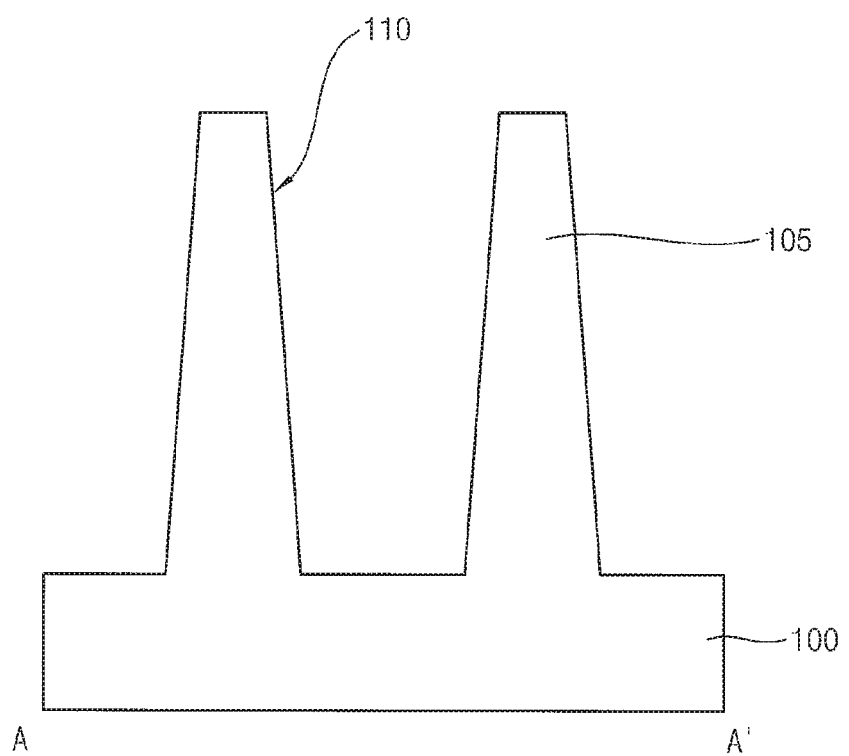

Referring first to FIGS. 1 and 2, an upper portion of a substrate 100 may be partially etched to form trenches 110. As the trenches 110 are formed in the substrate 100, active fins 105 may be formed.

The substrate 100 may include a semiconductor material, e.g., silicon, germanium, silicon-germanium, etc., or III-V semiconductor compounds, e.g., GaP, GaAs, GaSb, etc. In some examples, the substrate 100 may be a silicon-on-insulator (SOI) substrate, or a germanium-on-insulator (GOI) substrate.

The substrate 100 may include a single crystalline semiconductor material, and thus each active fin 105, which may be formed from the substrate 100, may have single crystallinity.

In examples of the inventive concept, each active fin 105 may extend in a first direction substantially parallel to an upper surface of the substrate 100, and the active fins 105 may be spaced in a second direction substantially parallel to the upper surface of the substrate 100 and crossing the first direction. In examples of the inventive concept, the first and second directions may be substantially perpendicular to each other.

In examples of the inventive concept, the active fin 105 may have a constant width from a top toward a bottom thereof. In some examples of the inventive concept, the active fin 105 may have a width gradually increasing from a top toward a bottom thereof. Thus, a gap between the active fins 105 in the second direction may be constant or gradually decrease from a top toward a bottom thereof.

Figure 3:
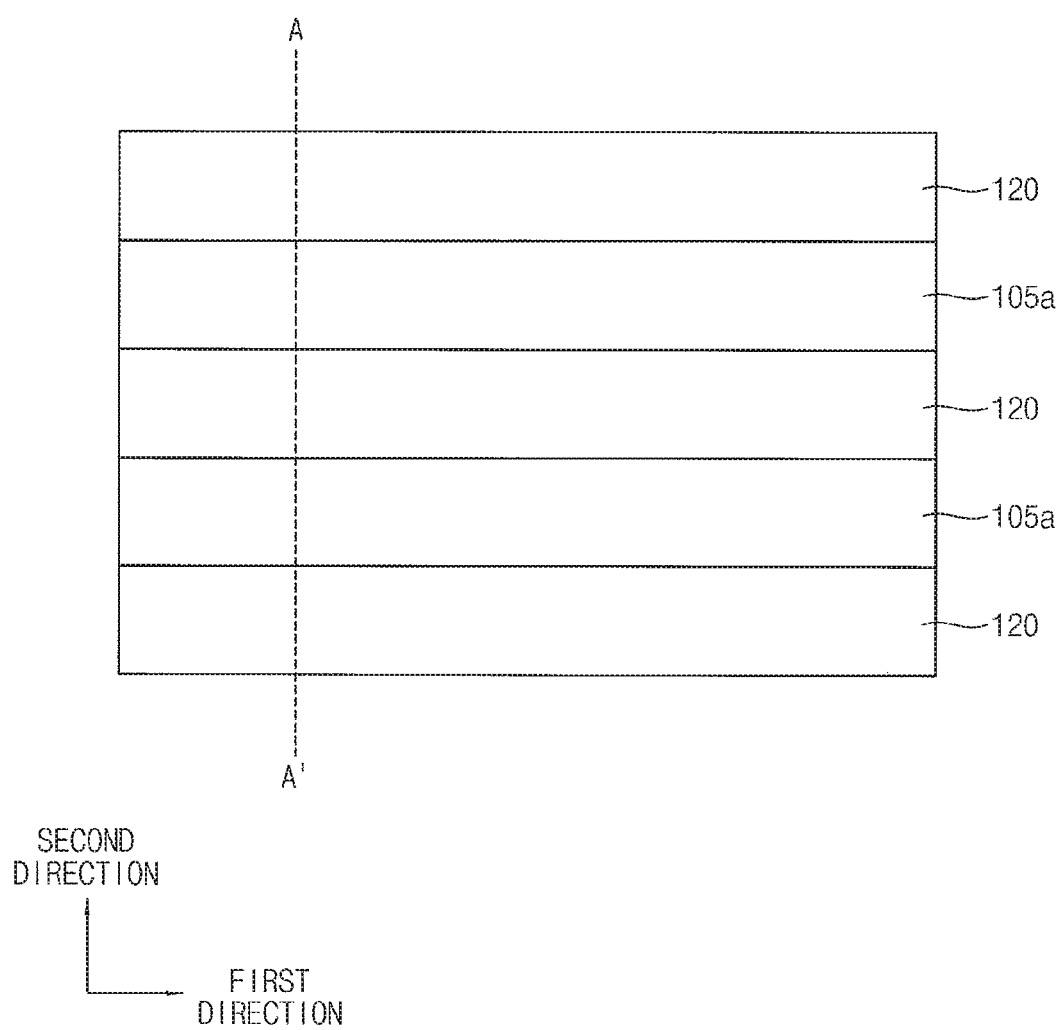
Figure 4:
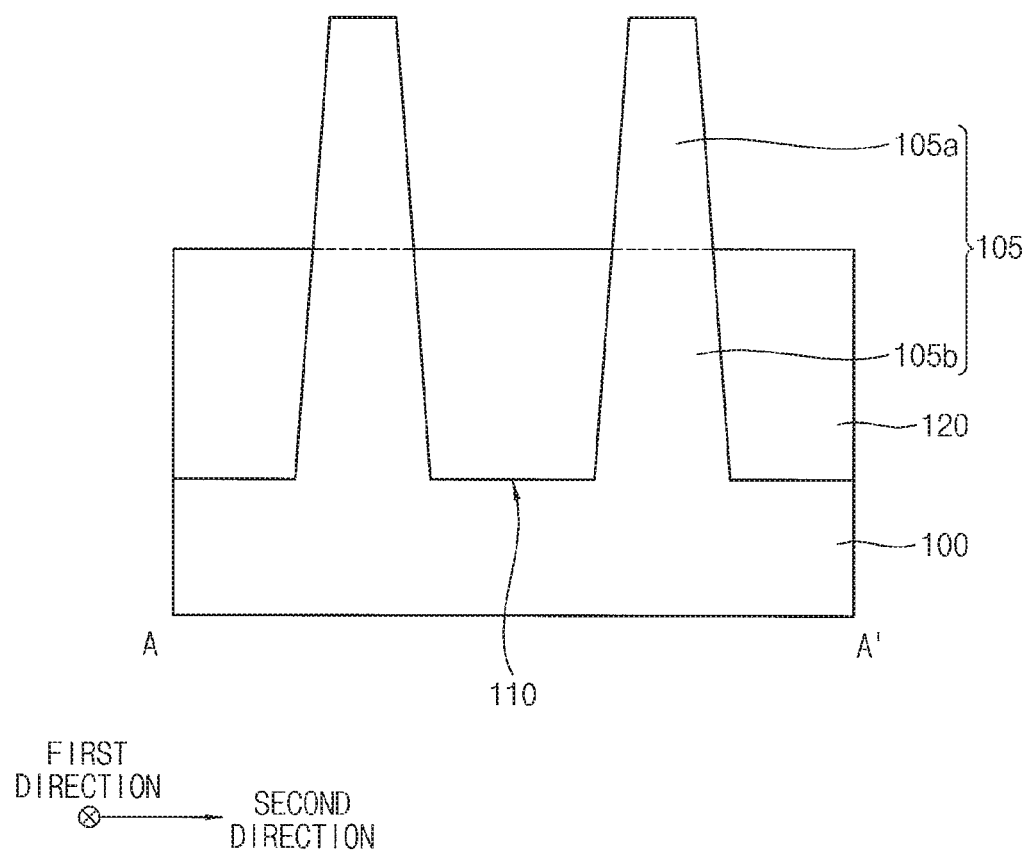
Figure 5:
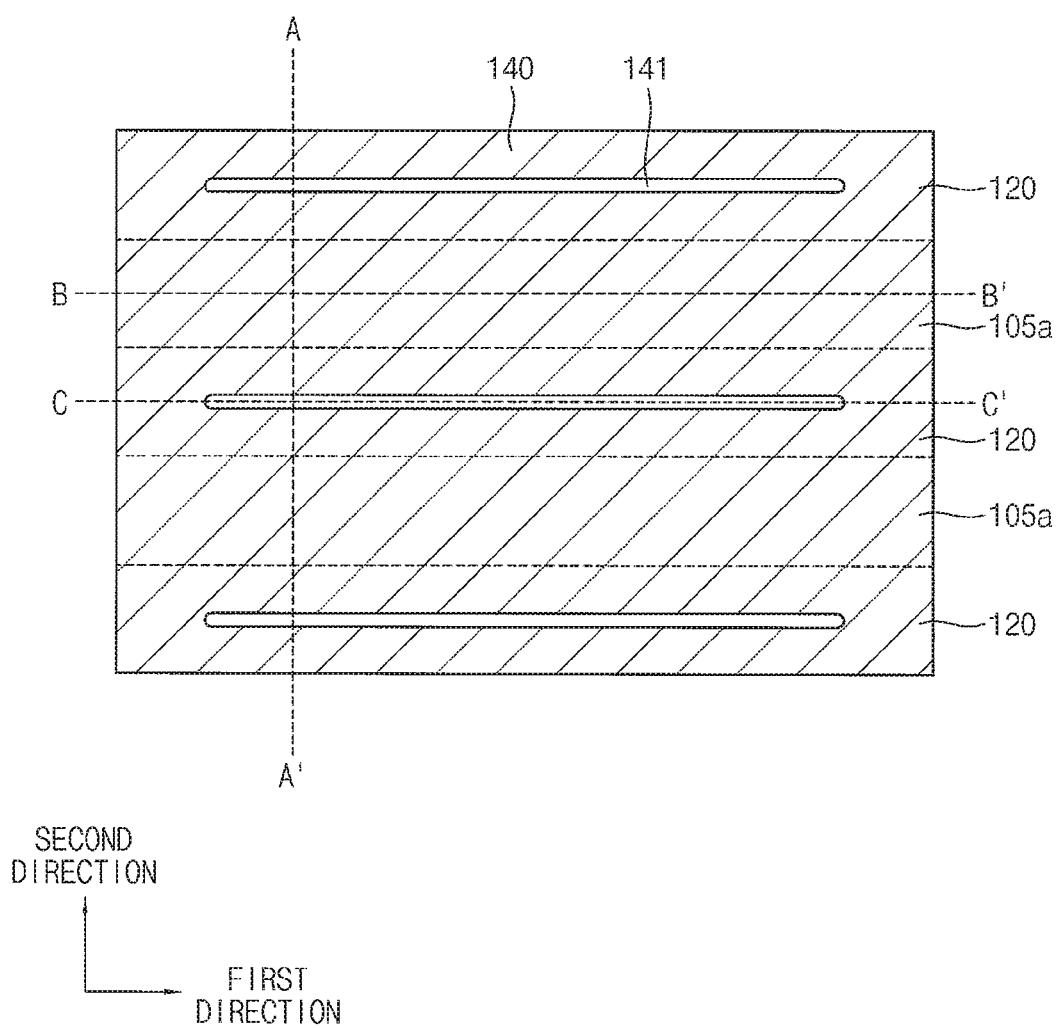
Figure 6:
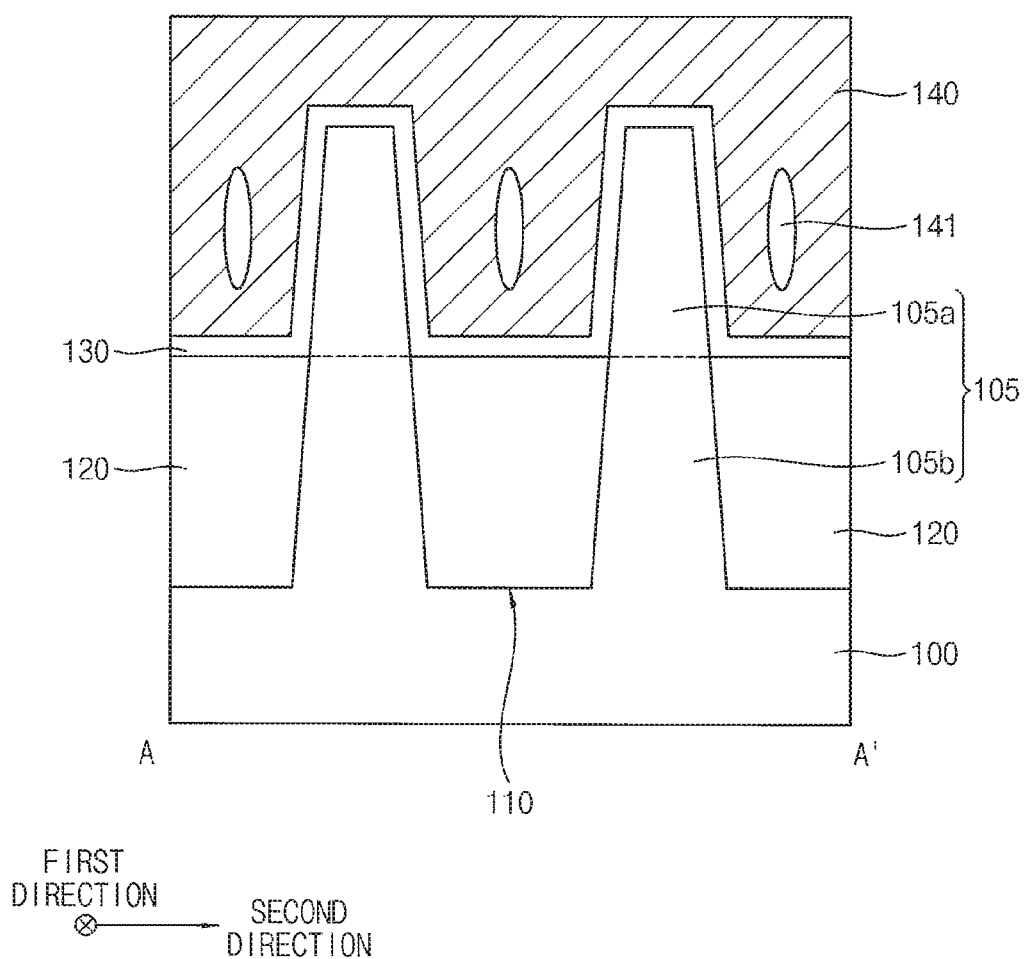

Referring to FIGS. 3 and 4, an isolation pattern 120 may be formed to fill a lower portion of the trench 110.

In examples of the inventive concept, the isolation pattern 120 may be formed by forming an isolation layer on the substrate 100 to sufficiently fill the trench 110, planarizing the isolation layer until the upper surface of the substrate 100 is exposed, and removing an upper portion of the isolation layer to expose an upper portion of the trench 110. The isolation layer may be formed of an oxide, e.g., silicon oxide.

In examples of the inventive concept, the active fin 105 may include a lower active pattern 105b whose sidewall may be covered by the isolation pattern 120, and an upper active pattern 105a not covered by the isolation pattern 120 but protruding therefrom. In examples of the inventive concept, the upper active pattern 105a may serve as an active region, and a portion of the substrate 100 whose upper surface is covered by the isolation pattern may serve as a field region. Hereinafter, the greatest gap between adjacent ones of the upper active patterns 105a in the second direction may be referred to as a first width.

In examples of the inventive concept, the isolation pattern 120 may be formed to have a multi-layered structure. For example, the isolation pattern 120 may include an insulation liner (not shown) lining each trench 110 and a filling insulation layer (not shown) filling a remaining portion of the trench 110 on the insulation liner. In this case, the insulation liners may be formed of silicon oxide, silicon nitride, or the like.

Referring to FIGS. 5 to 8, a dummy gate insulation layer 130 may be formed on the upper active pattern 105a. A preliminary first polysilicon layer 140 may be formed on the dummy gate insulation layer 130 to sufficiently fill the gaps between the upper active patterns 105a.

In examples of the inventive concept, the dummy gate insulation layer 130 may be formed of silicon oxide, for example. In examples of the inventive concept, the dummy gate insulation layer 130 may be formed by a thermal oxidation process on an upper portion of the substrate 100, and in this case, the dummy gate insulation layer 130 may be formed only on the upper active patterns 105a. Alternatively, the dummy gate insulation layer 130 may be formed by a chemical vapor deposition (CVD) process or an atomic layer deposition (ALD) process, and in this case, the dummy gate insulation layer 130 may be conformally formed on the upper active patterns 105a and the isolation pattern 120.

The preliminary first polysilicon layer 140 may be formed on the dummy gate insulation layer 130. In examples of the inventive concept, the preliminary first polysilicon layer 140 may be formed to have a thickness substantially the same as or greater than about ½ of the first width, so that the gaps between the upper active patterns 105a may be sufficiently filled by the preliminary first polysilicon layer 140.

If a portion of the preliminary first polysilicon layer 140 on a top surface of the upper active pattern 105a has an excessively great thickness, it may be difficult to remove a void in the preliminary first polysilicon layer 140. Thus, the preliminary first polysilicon layer 140 may be formed to have a thickness less than a target thickness of a gate structure 198 (refer to FIGS. 34 to 36) subsequently formed.

In examples of the inventive concept, the preliminary first polysilicon layer 140 may be formed to have a thickness of about ½ to about 1 times the first width. In examples of the inventive concept, the preliminary first polysilicon layer 140 may be formed to have a thickness of about 100 Å to 500 Å. However, the thickness of the preliminary first polysilicon layer 140 is not limited thereto.

In examples of the inventive concept, the preliminary first polysilicon layer 140 may be formed by a CVD process or an ALD process. The preliminary first polysilicon layer 140 may be formed at a temperature of about 300° C. to about 700° C.

Figure 8:
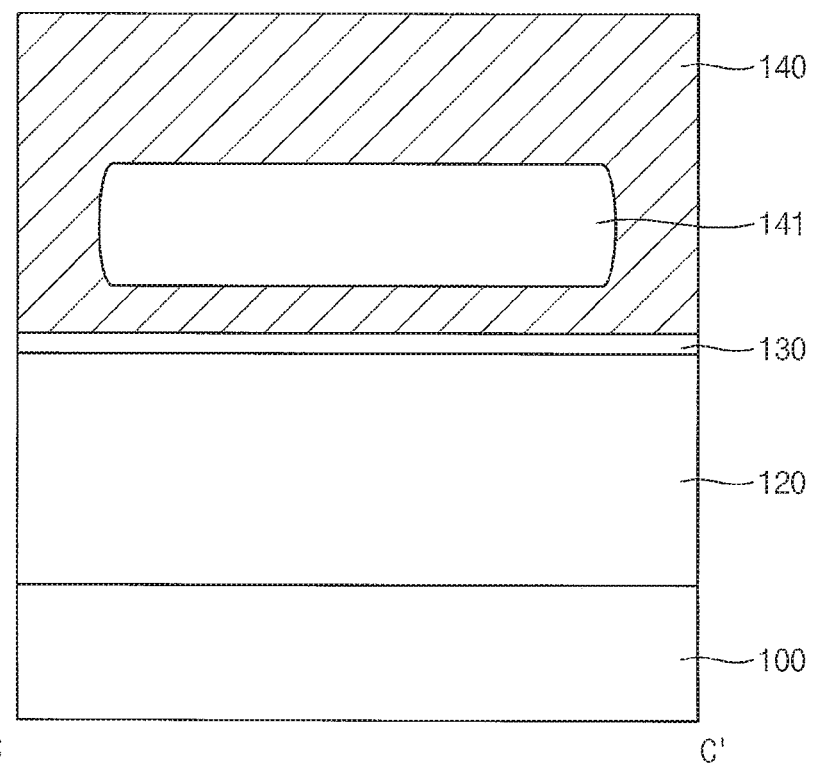

A portion of the preliminary first polysilicon layer 140 filling a gap between upper active patterns 105a may include a void 141 therein. The void 141 may be formed by depositing the preliminary first polysilicon layer 140 on side surfaces of the upper active patterns 105a and an upper surface of the isolation pattern 120. Thus, the void 141 may be formed at a central portion of the gap between adjacent upper active patterns 105a in the second direction. Also, the void 141 may have a tunnel-like shape extending in the first direction, as shown in FIG. 8.

Figure 9:
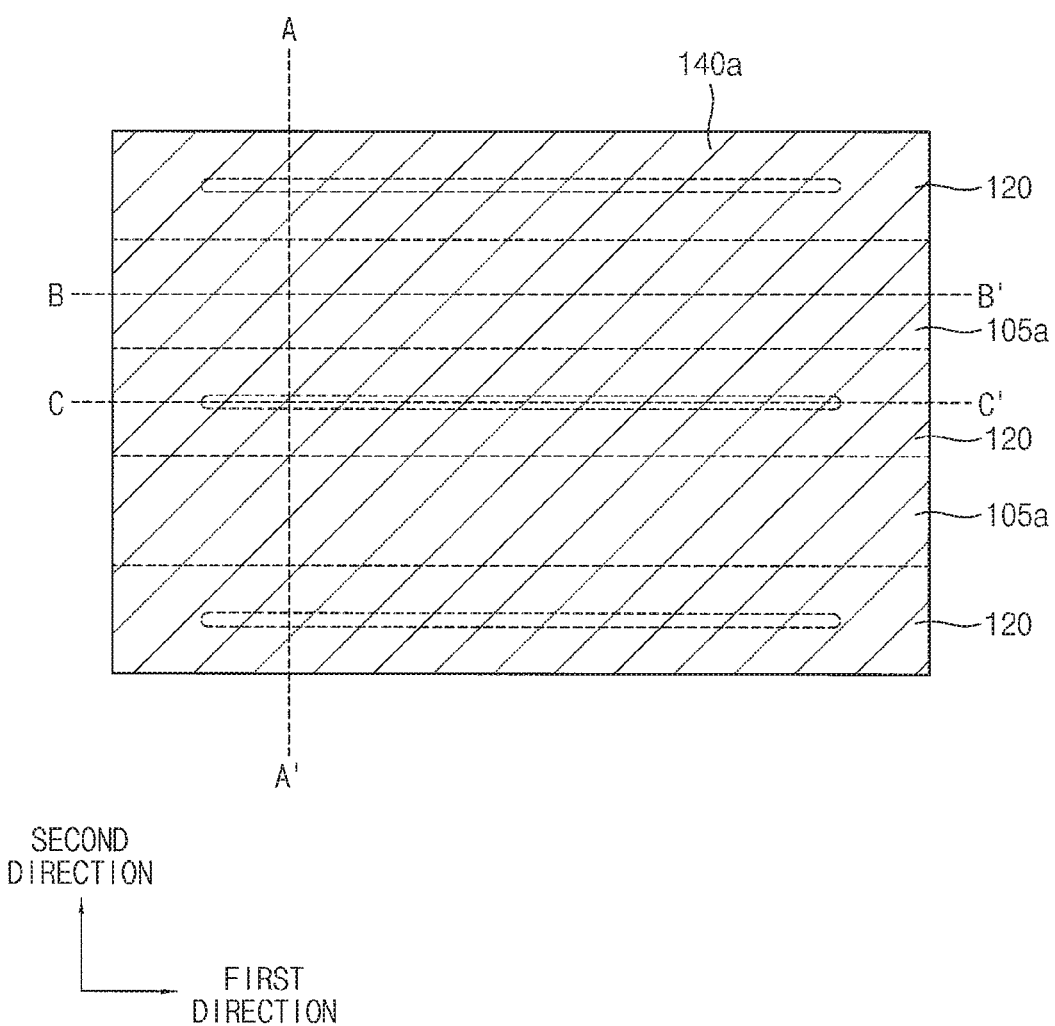
Figure 10:
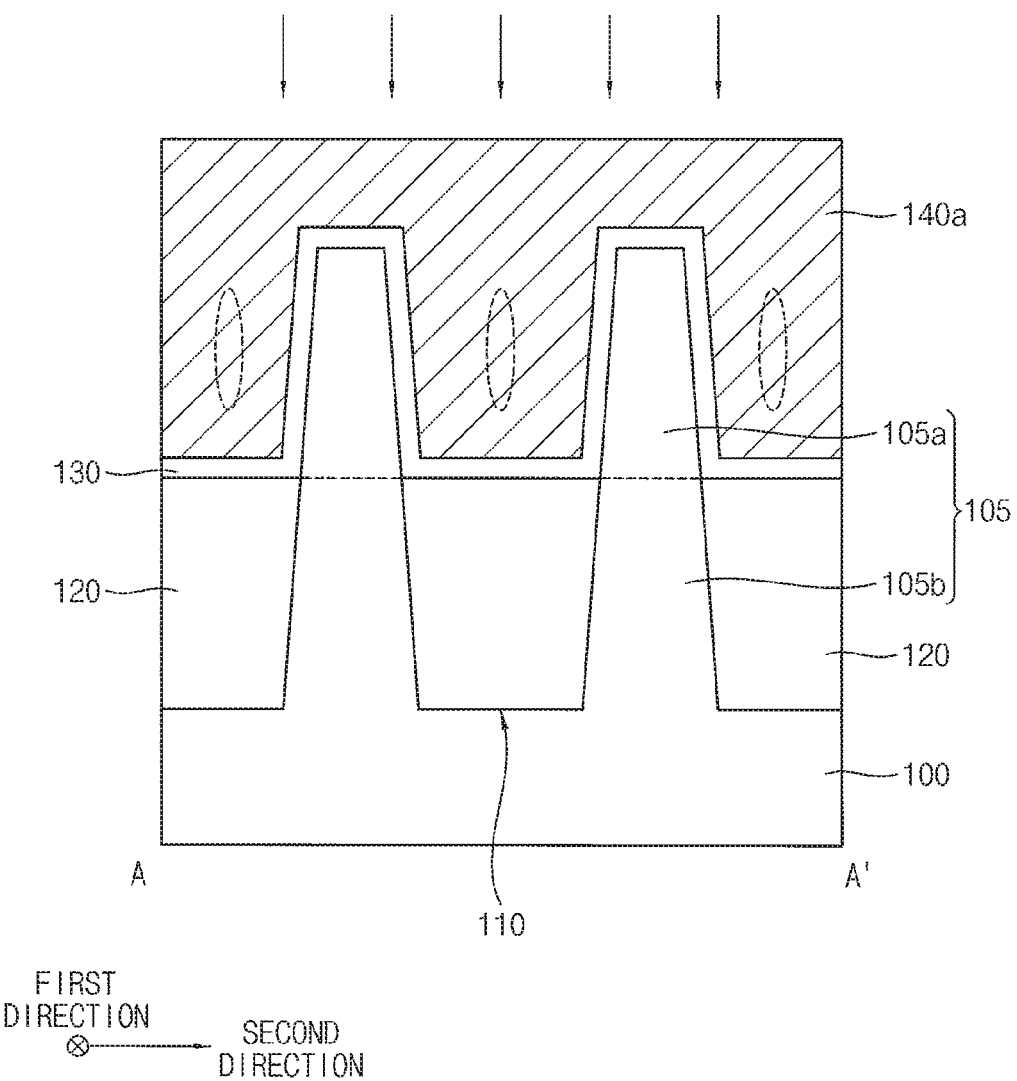
Figure 11:
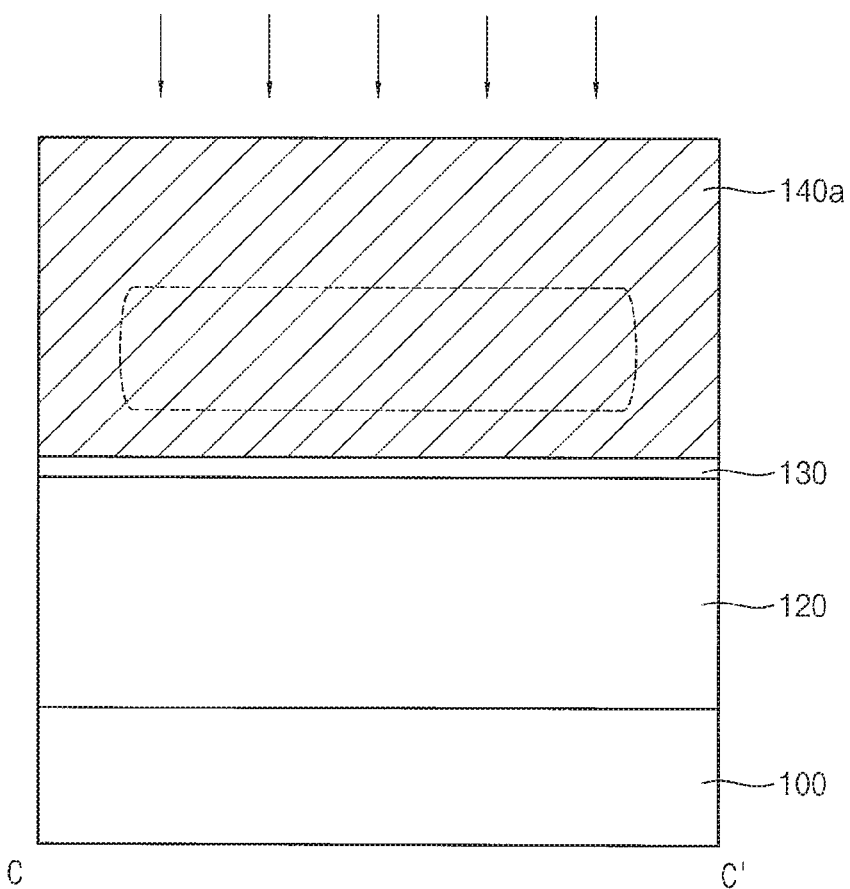
Figure 12:
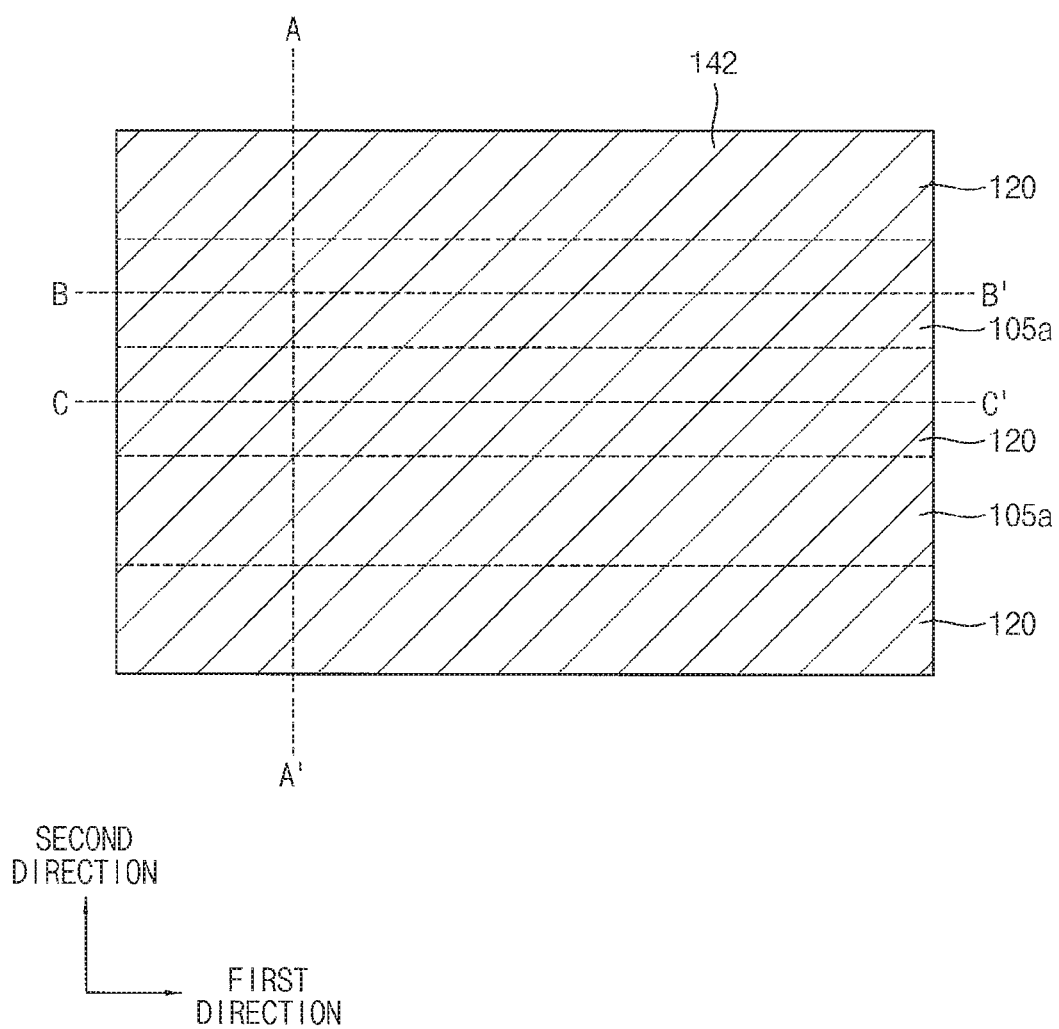
Figure 13:
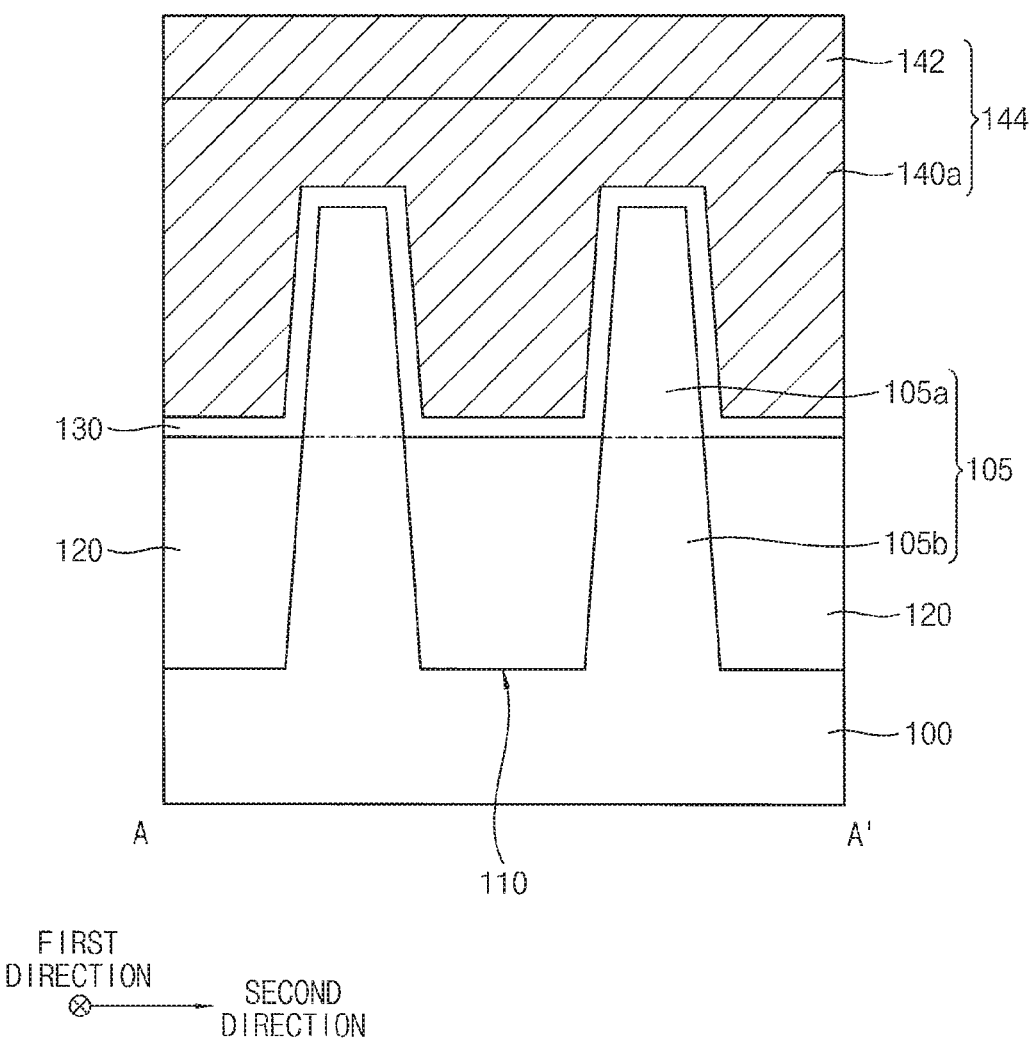
Figure 14:
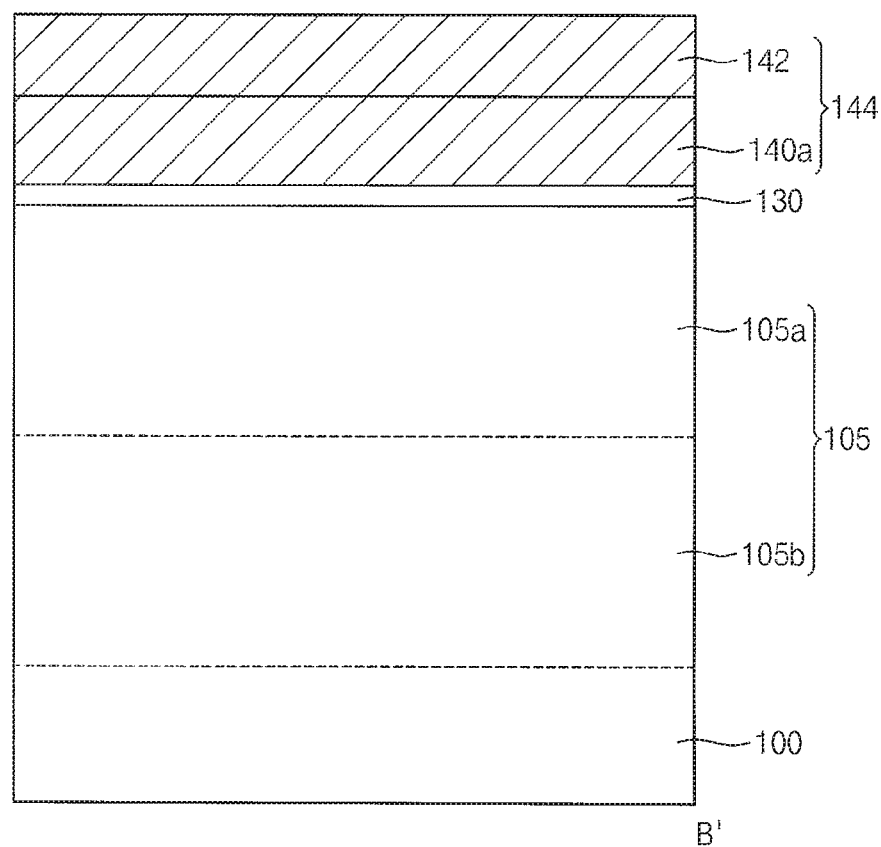
Figure 16:
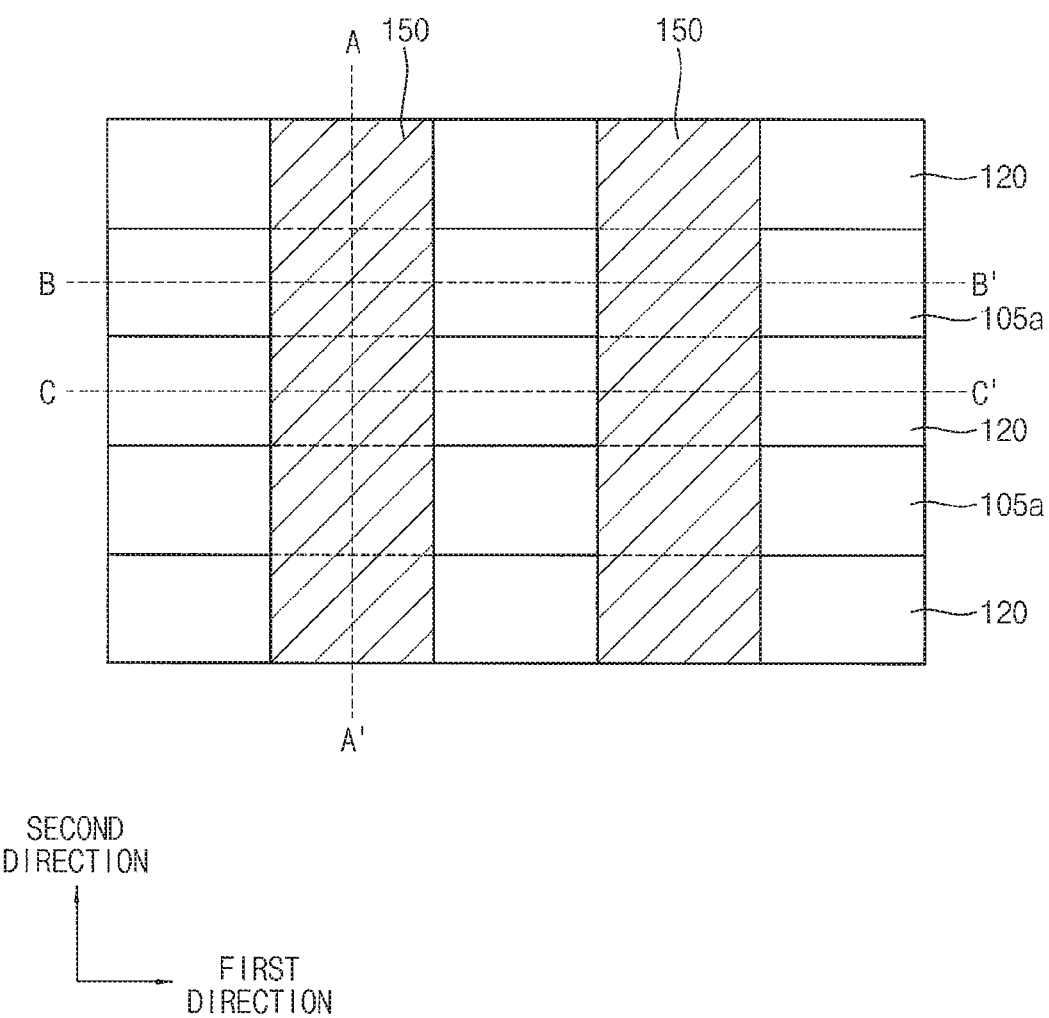
Figure 17:
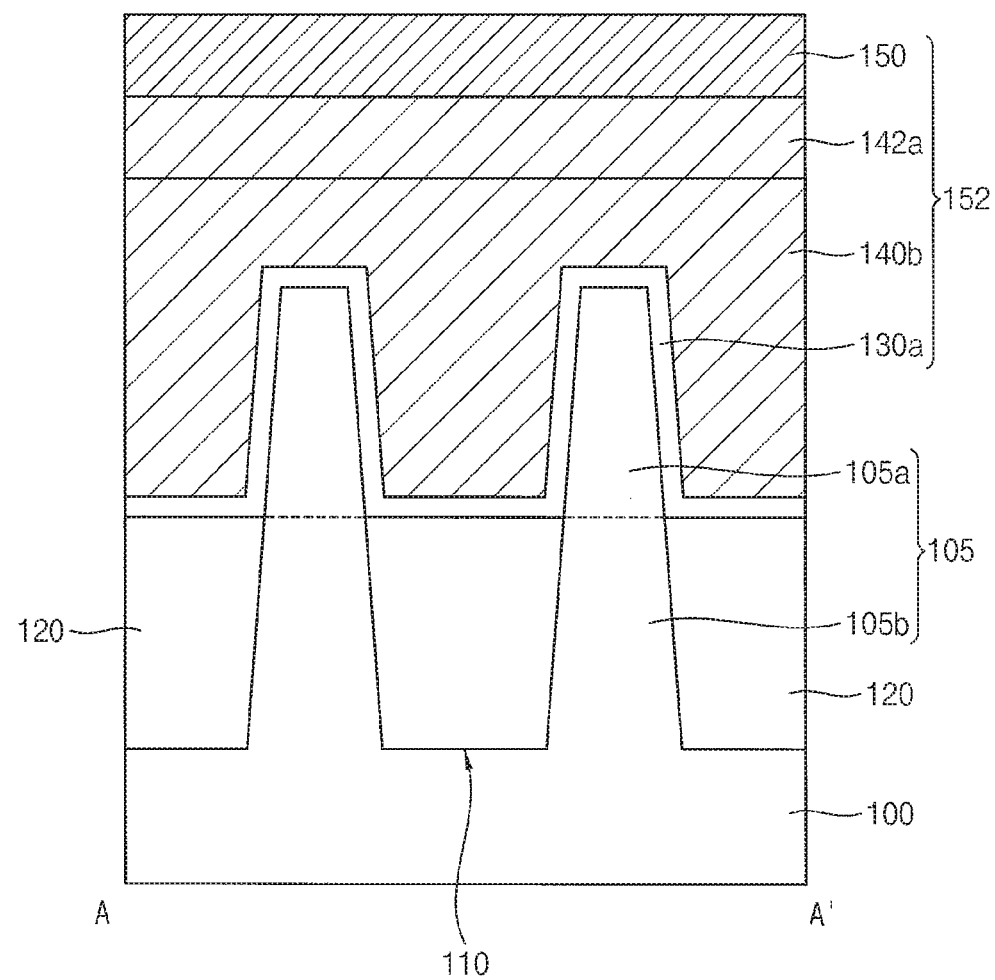
Figure 18:
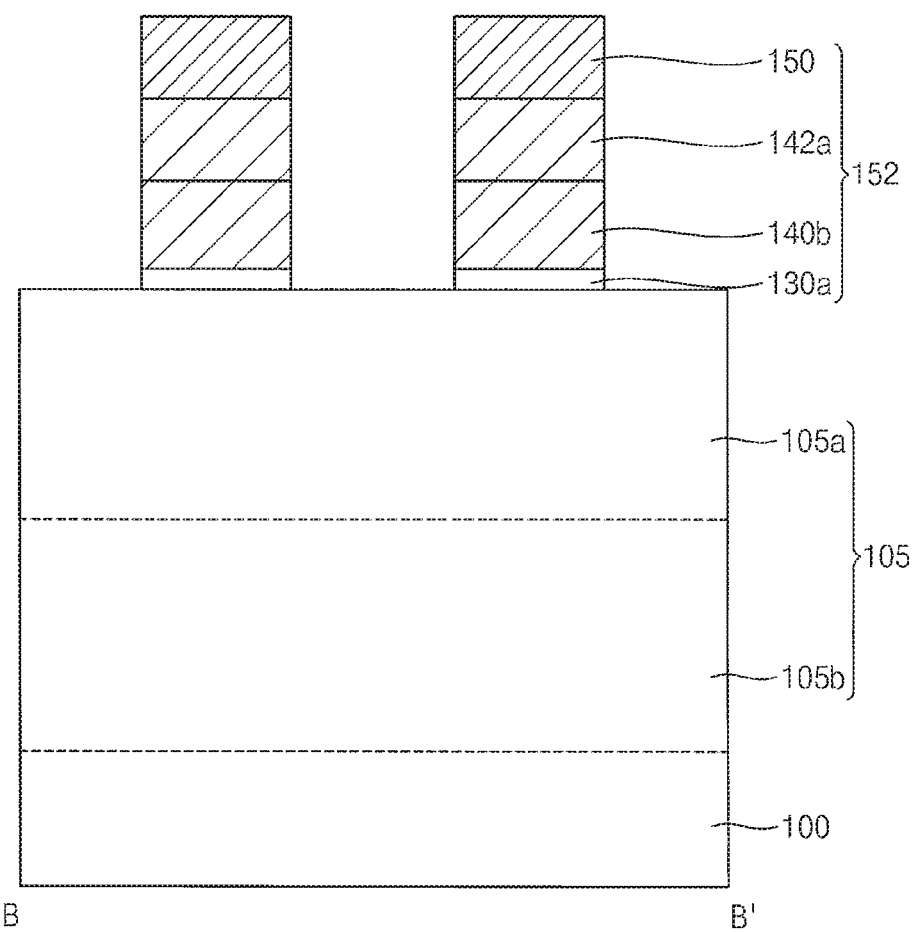
Figure 19:
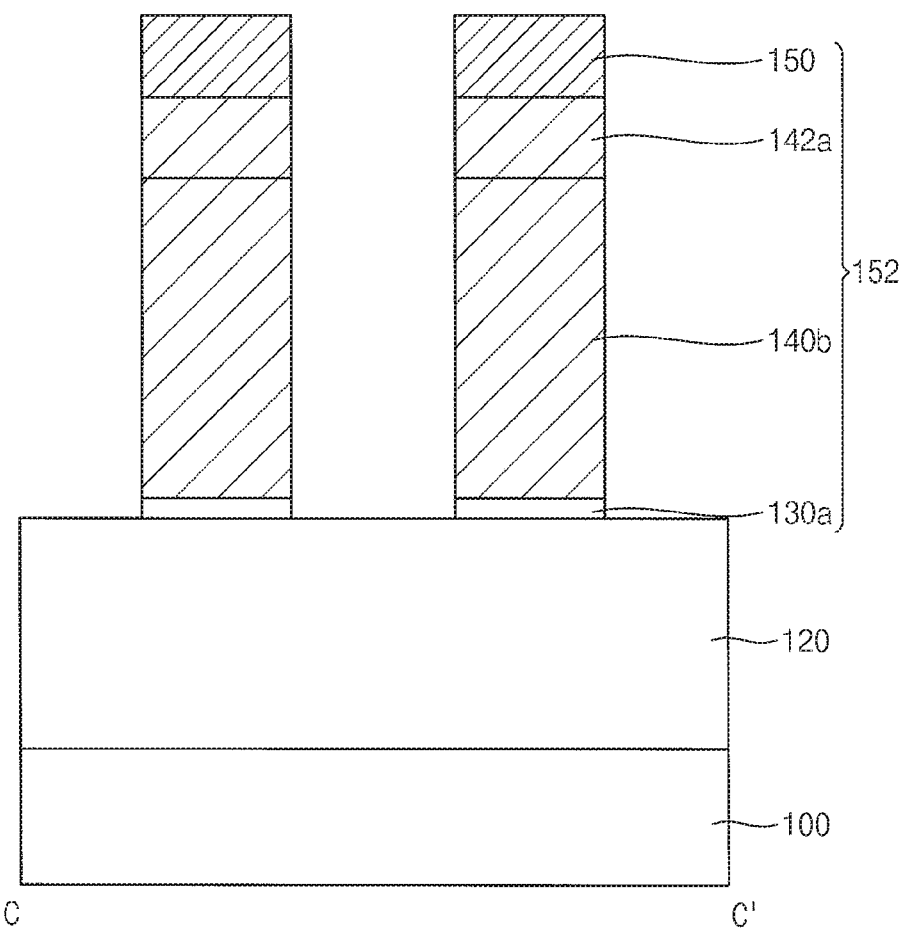

Referring to FIGS. 9 to 11, the preliminary first polysilicon layer 140 may be doped with electrically neutral dopant by an ion implantation process to form a first or polysilicon layer 140a having no void therein. During the ion implantation process, the active fin 105 may maintain single crystallinity. Due to the ion implantation process, silicon lattices in the preliminary first polysilicon layer 140 may be rearranged so that the void 141 may be removed.

In examples of the inventive concept, the dopant may include silicon. When the preliminary first polysilicon layer 140 is doped with silicon ions, the void 141 may be filled by the silicon ions, and thus the void 141 may be effectively removed. Thus, it may be considered that the first polysilicon layer 140 is a consolidated layer comprising polysilicon and more specifically, consisting of polysilicon.

In examples of the inventive concept, an ion of the dopant may include silicon ions and other ions, e.g., carbon ions, germanium ions, etc. Alternatively, an ion of the dopant may not include silicon ions but may include other ions having no conductivity, e.g., carbon ions, germanium ions, etc. In this case, during the ion implantation process, silicon lattices in the preliminary first polysilicon layer 140 may be rearranged, and the void 141 may be filled by the silicon ions, the carbon ions and/or the germanium ions. Thus, the void 141 may be removed. In these cases, the first polysilicon layer 140 may also be considered as a consolidated layer comprising polysilicon.

When the ion implantation process is performed, the upper active patterns 105a may maintain single crystallinity, and may not be changed into an amorphous state. Also, preferably, during the ion implantation process, the upper active patterns 105a may not have crystal defects and/or particles therein. Thus, the ion implantation process may be performed at a temperature of about 100° C. to about 700° C., and preferably at a temperature of about 300° C. to about 600° C. Here, the term "about" may refer to a slight difference in the desired or set temperature due to inherent or latent characteristics of the controller of the ion implantation process or environment in which the ion implantation process is taking place. That is, in examples of the inventive concept, the ion implantation process is preferably performed at a temperature with the range of 100° C. to 700° C.

If the ion implantation process is performed at a temperature of less than about 100° C., the upper active pattern 105a may be damaged, and thus may assume an amorphous state. When an annealing process is performed on the upper active pattern 105a after the ion implantation process, the upper active pattern 105a may be recrystallized to have single crystallinity. However, in this case, the upper active pattern 105a may have lattice defects therein.

If the ion implantation process is performed at a temperature of more than about 700° C., the upper active pattern 105a and the preliminary first polysilicon layer 140 may be damaged by heat.

In examples of the inventive concept, in the ion implantation process, energy and dose may be controlled to remove the void 141.

In the ion implantation process using silicon ions, when the ion implantation energy is less than about 10 keV, the void 141 may not be effectively removed. When the ion implantation energy is more than about 50 keV, the upper active pattern 105a and the preliminary first polysilicon layer 140 may be damaged by the energy. Thus, the ion implantation energy is preferably in a range of 10 keV to 50 keV.

In the ion implantation process using silicon ions, when the dose of the silicon ions is less than about $1E13/cm^2$, the void 141 may not be effectively removed. When the dose of the silicon ions is more than about $1E16cm^2$, the upper active pattern 105a and the preliminary first polysilicon layer 140 may be damaged. Thus, the dose of the silicon ions is preferably in a range of $1E13/cm^2$ to $1E16/cm^2$.

Alternatively, in the ion implantation process using silicon ions, the carbon ions and/or germanium ions, for example, the ion implantation energy is preferably in a range of 10 keV to 50 keV, and the dose of the ions is preferably in a range of $1E13/cm^2$ to $1E16/cm^2$.

In examples of the inventive concept, the deposition process of the preliminary first polysilicon layer 140 and the ion implantation may be performed in-situ.

Thus, the first polysilicon layer 140a having no void may be formed, and the active fin 105 may maintain single crystallinity.

Referring to FIGS. 12 to 15, a second polysilicon layer 142 may be formed on the first polysilicon layer 140a. The first and second polysilicon layers 140a and 142 may be merged into one polysilicon layer 144, which may serve as a mold layer for forming the gate structure. Thus, the polysilicon layer 144 may be formed to have a thickness substantially the same as a target thickness of the gate structure.

In examples of the inventive concept, the second polysilicon layer 142 may have a thickness of about 500 Å to the 2000 Å. However, the thickness of the second polysilicon layer 142 is not limited thereto. Again, here, the term "about" may refer to a slight variation from the specification of the process due to some inherent characteristic of the process. The thickness of second polysilicon layer 142 may be specified according to the target thickness of the gate structure.

In examples of the inventive concept, the second polysilicon layer 142 may be formed by processes substantially the same as processes of forming the preliminary first polysilicon layer 140. In examples of the inventive concept, the second polysilicon layer 142 may be formed by a CVD process or an ALD process. The second polysilicon layer 142 may be formed at a temperature of about 300° C. to about 700° C.

Referring to FIGS. 16 to 19, a first hard mask 150 may be formed on the second polysilicon layer 142. The first and second polysilicon layers 140a and 142 and the dummy gate insulation layer 130 may be etched using the first hard mask 150 as an etching mask to form dummy gate structures 152. The upper active pattern 105a may be exposed by the dummy gate structures 152.

In examples of the inventive concept, the dummy gate structures 152 may be formed by forming a hard mask layer on the second polysilicon layer 142, patterning the hard mask layer using a photoresist pattern as an etching mask to form the first hard mask 150, and sequentially etching the second and first polysilicon layers 142 and 140a and the dummy gate insulation layer 130 using the first hard mask 150 as an etching mask. Thus, each dummy gate structure 152 may include a dummy gate insulation pattern 130a, a first polysilicon pattern 140b, a second polysilicon pattern 142a and the first hard mask 150 sequentially stacked.

In examples of the inventive concept, each dummy gate structure 152 may be formed to extend in the second direction, and a plurality of dummy gate structures 152 may be spaced from one another in the first direction.

If the void 141 were to remain in the first polysilicon layer contrary to the inventive concept, a portion of the first polysilicon layer 140a adjacent to the void 141 could be etched more than the other portions of the first polysilicon layer 140a. Thus, side surfaces of the first and second polysilicon patterns 140b and 142a would not be entirely vertical, i.e., parts of the surfaces would not have a 90 degree slope, with respect to the upper surface of the substrate 100. The portion of the first polysilicon layer 140a adjacent to the void 141 may be excessively etched, so that an upper active pattern 105a may be damaged. In particular, a lower portion of the upper active pattern 105a may have an undercut in a side thereof, and the void 141 may be exposed at the side of the first polysilicon pattern 140b.

However, according to the inventive concept, any voids in the first polysilicon layer 140a are removed so that the first polysilicon layer 140a may be uniformly etched. Thus, the side surfaces of the first and second polysilicon patterns 140b and 142a may be substantially vertical, i.e. perpendicular to the upper surface of the substrate 100, and no void is exposed at a side of the first polysilicon pattern 140b. Also, the upper active pattern 105a is prevented from being damaged.

Figure 20:
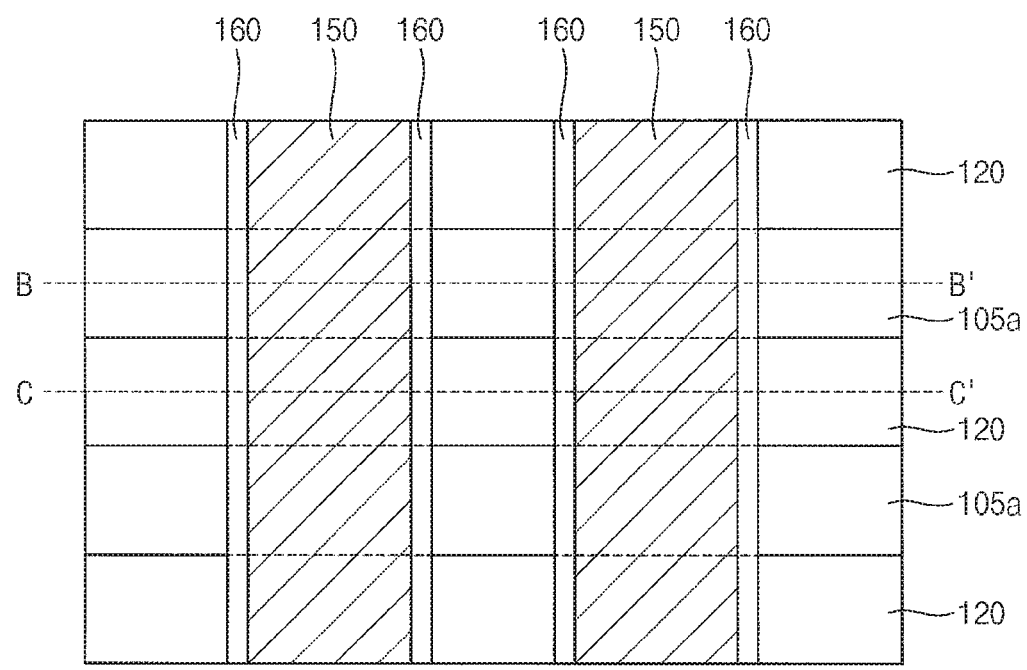
Figure 21:
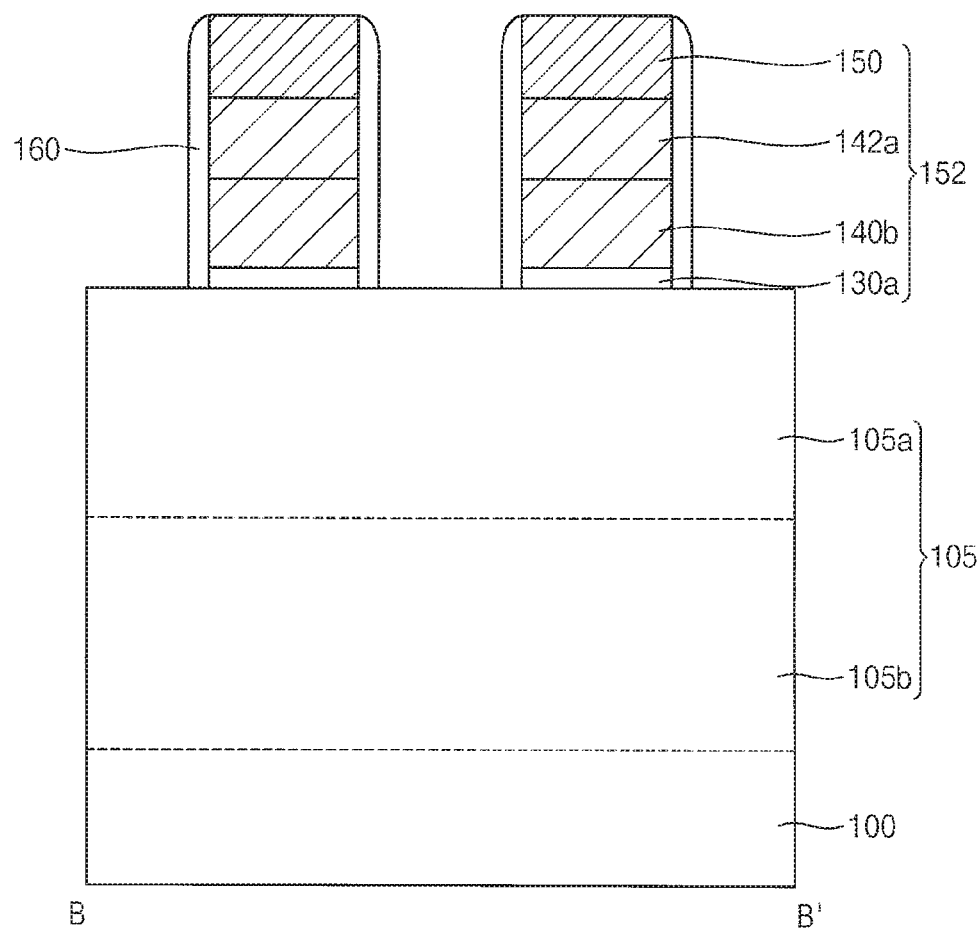
Figure 22:
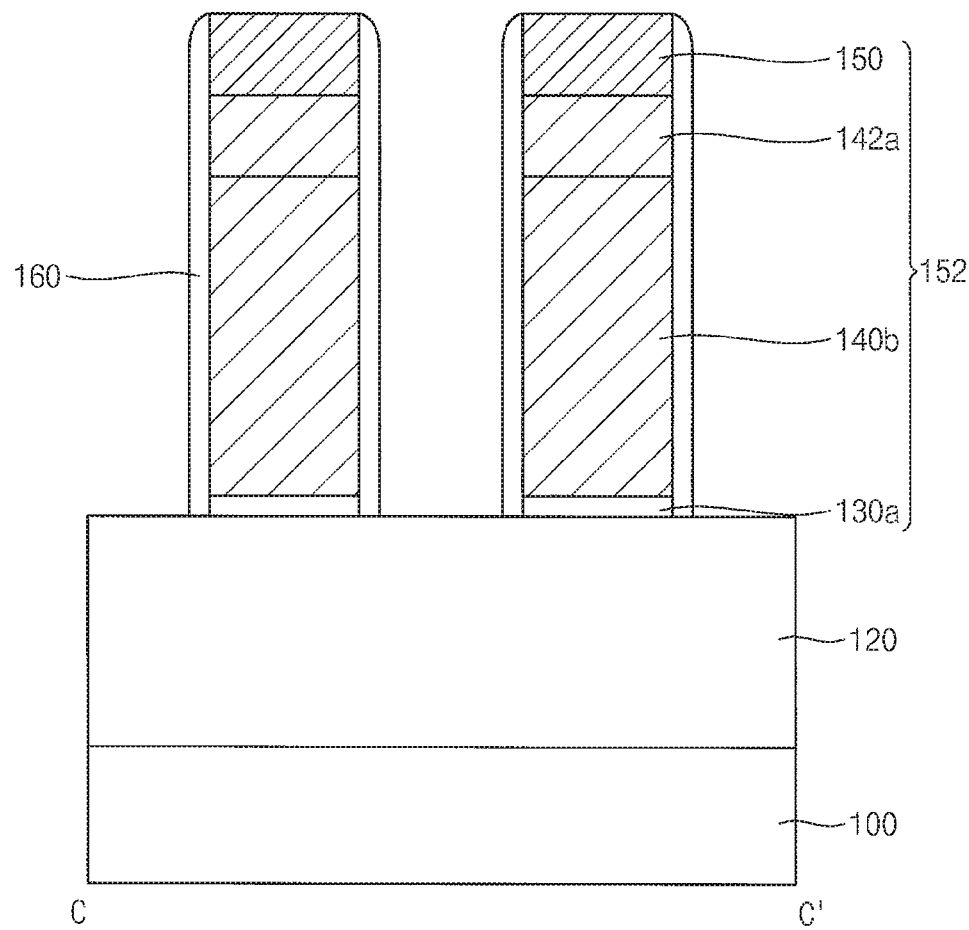

Referring to FIGS. 20 to 22, a spacer layer may be formed on the dummy gate structures 152, the isolation pattern 120 and the upper active patterns 105a. The spacer layer may be anisotropically etched to form a spacer structure 160 on side surfaces of each dummy gate structure 152.

The spacer layer may be a layer of material selected from the group consisting or silicon nitride, silicon carbonitride (SiCN) and silicon oxycarbonitride (SiOCN). For example, the spacer layer may be formed of SiOCN, thereby having a dielectric constant less than that of silicon nitride. In examples of the inventive concept, the spacer layer may be formed by a CVD process or an ALD process. Also, more than one layer from this group may be formed to produce the spacer structure 160.

Again, if a void 141 were to remain in the polysilicon layer contrary to the inventive concept, and become exposed at the side of the first polysilicon pattern 140b, the spacer layer would fill the void 141, and thus the first polysilicon pattern 140b would have part of the spacer layer therein. In this case, subsequent processes would be prone to process failures generated by the spacer layer in the first polysilicon pattern 140b. Also, the spacer structure 160 on the side surfaces of the first and second polysilicon patterns 140b and 142a adjacent the void 141 would not have a normal shape.

However, in examples of the inventive concept, the side surfaces of the first and second polysilicon patterns 140b and 142a may be substantially vertical, i.e., perpendicular to the upper surface of the substrate 100, and no voids may be present in the first and second polysilicon patterns 140b and 142a. Thus, the spacer structure 160 may be normally formed on the sides of the dummy gate structure 152.

The spacer structure 160 may be also formed on the sides of the active fin 105.

In examples of the inventive concept, the spacer structure 160 may be formed as a single layer (as shown in FIGS. 20 to 22) but is not be limited thereto.

Alternatively, the spacer structure may include a plurality of spacers sequentially stacked on each side of the dummy gate structure 152. In particular, the plurality of spacers may be formed by sequentially forming a plurality of spacer layers on the dummy gate structures 152, the isolation pattern 120 and the upper active patterns 105a, anisotropically etching the plurality of spacer layers to form the spacer structure 160 including the plurality of spacers. In examples of the inventive concept, the spacer structure 160 may include an offset spacer, a first spacer and a second spacer sequentially stacked on the sides of each dummy gate structure 152.

The offset spacer may be formed of silicon oxide, and each of the first and second spacers may be formed of at least one material selected from the group consisting of silicon nitride, SiCN and SiOCN.

In examples of the inventive concept, the first spacer may not be removed by an isotropic etching process subsequently performed, and the second spacer may not be removed by an anisotropic etching process subsequently performed. That is, the first spacer may have an etching resistance with respect to the isotropic etching process, and the second spacer may have an etching resistance with respect to the anisotropic etching process.

In examples of the inventive concept, one of the spacers may be formed on each side of the dummy gate structure 152 as extending only in a vertical direction, and another of the spacers may be formed on the side of the dummy gate structure 152 and the upper surface of the substrate 100 so as to have an "L" shape.

Figure 23:
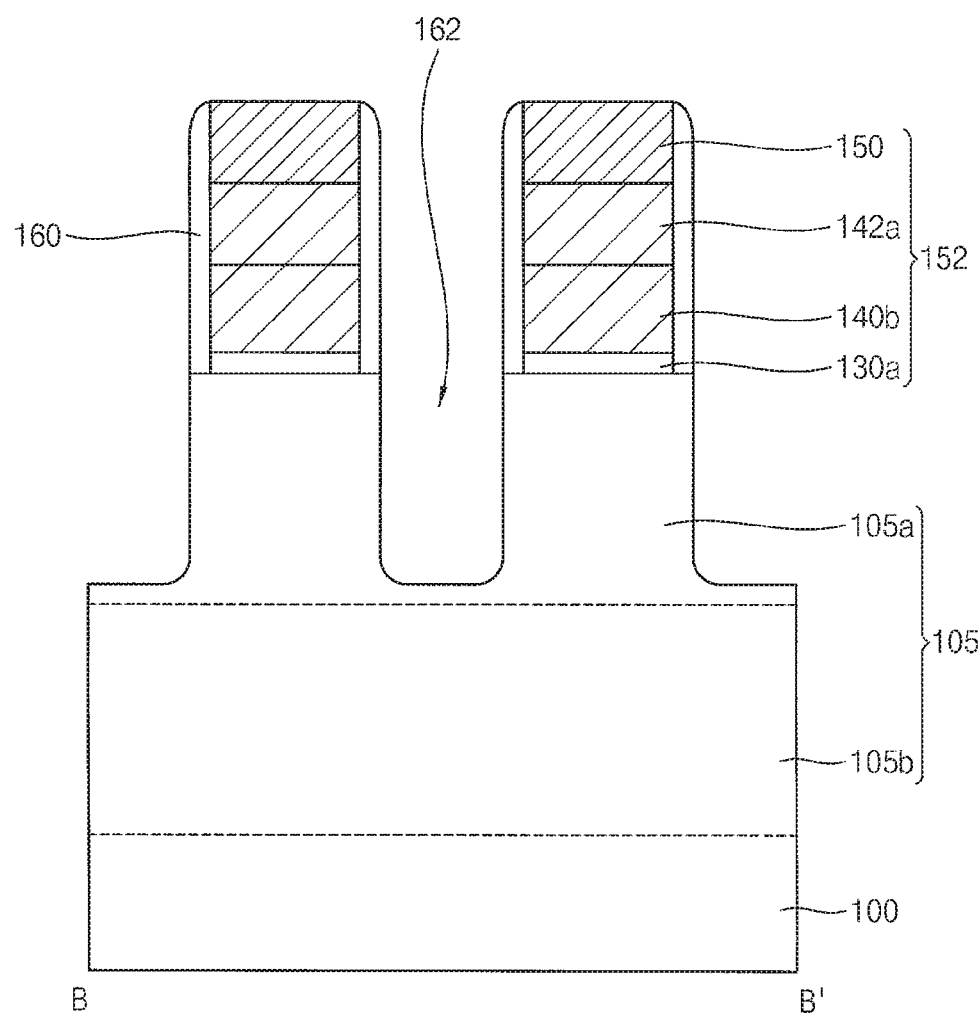

Referring to FIG. 23, an upper portion of the active fin 105 between adjacent ones of the spacer structures 160 may be etched to form a recess 162.

More specifically, the upper portion of the active fin 105 may be anisotropically etched using the dummy gate structures 152 and the spacer structures 160 on the sides thereof as an etching mask to form the recess 162. In examples of the inventive concept, when the recess 162 is formed, portions of the spacer structures 160 may be removed from the sides of the active fins 105.

In examples of the inventive concept, only the upper active pattern 105a of the active fins 105 may be etched to form the recess 162, so that a bottom of the recess 162 may be higher than a top surface of the lower active pattern 105b. However, the position of the bottom of the recess 162 may not be limited thereto.

In examples of the inventive concept, the etching process for forming the spacer structures 160 and the etching process for forming the recess 162 may be performed in-situ.

Figure 24:
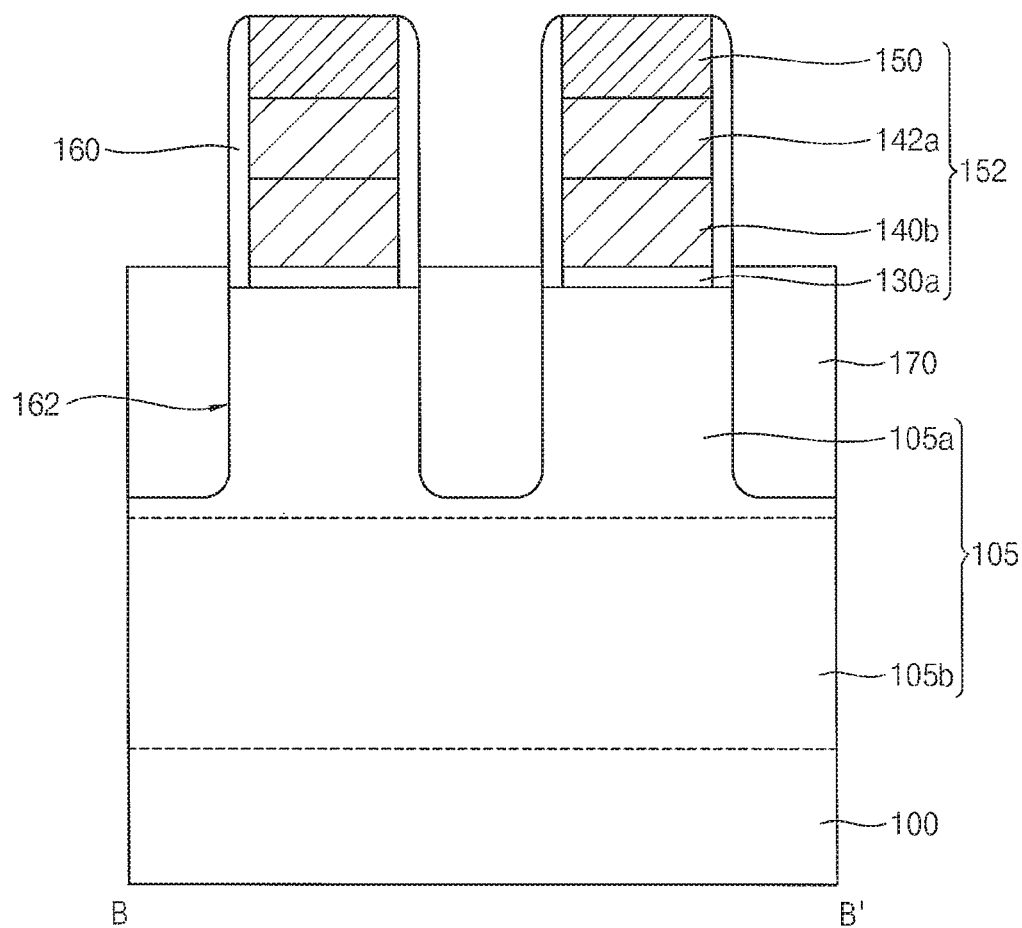

Referring to FIG. 24, an epitaxial pattern 170 may be formed in the recess 162. The epitaxial pattern 170 may serve as a source/drain region. In examples of the inventive concept, a plurality of epitaxial patterns 170 may be formed as spaced in the second direction, and neighboring ones of the epitaxial patterns 170 in the second direction may contact each other.

In examples of the inventive concept, the epitaxial pattern 170 may be formed by a selective epitaxial growth (SEG) process using an upper surface of the active fin 105 exposed by the recess 162 as a seed.

In examples of the inventive concept, the SEG process may be formed by providing a silicon source gas, a germanium source gas, an etching gas and a carrier gas. In these examples, the SEG process may be performed using silane ($SiH_4$), disilane ($Si_2H_6$), or dichlorosilane (DCS) ($SiH_2Cl_2$) as the silicon source gas, germane ($GeH_4$) as the germanium source gas, hydrogen chloride (HCl) as the etching gas, and hydrogen ($H_2$) as the carrier gas. Thus, the epitaxial pattern 170 including single crystalline silicon-germanium may be formed.

In examples of the inventive concept, during the SEG process, the epitaxial pattern 170 may be doped with p-type impurities in-situ, so that the epitaxial pattern 170 may serve as a source/drain region of a p-type FinFET.

Alternatively, the SEG process may be performed using only the silicon source gas, the etching gas and the carrier gas. Thus, the epitaxial pattern 170 including single crystalline silicon may be formed. In examples of the inventive concept, during the SEG process, the epitaxial pattern 170 may be doped with n-type impurities in-situ, so that the epitaxial pattern 170 may serve as a source/drain region of an n-type FinFET.

In some examples of the inventive concept, the etching process for forming the recess 162 and the SEG process for forming the epitaxial pattern 170 may not be performed. In this case, an upper portion of the upper active pattern 105a adjacent to the dummy gate structure 152 may be doped with impurities to form the source/drain region.

In some examples of the inventive concept, the dummy gate structure 152 may be used as an actual gate structure, and in this case, subsequent processes may not be performed, and a method of manufacturing a transistor including the gate structure and the source/drain region is completed at this point.

Figure 25:
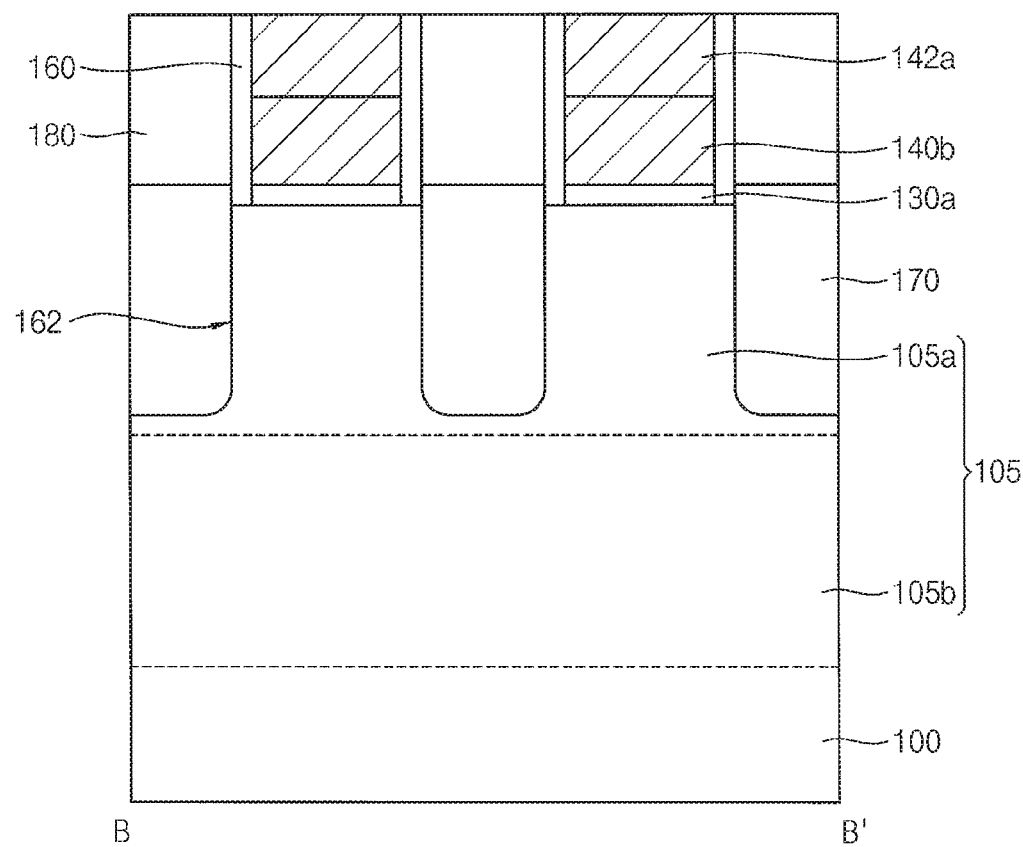
Figure 26:
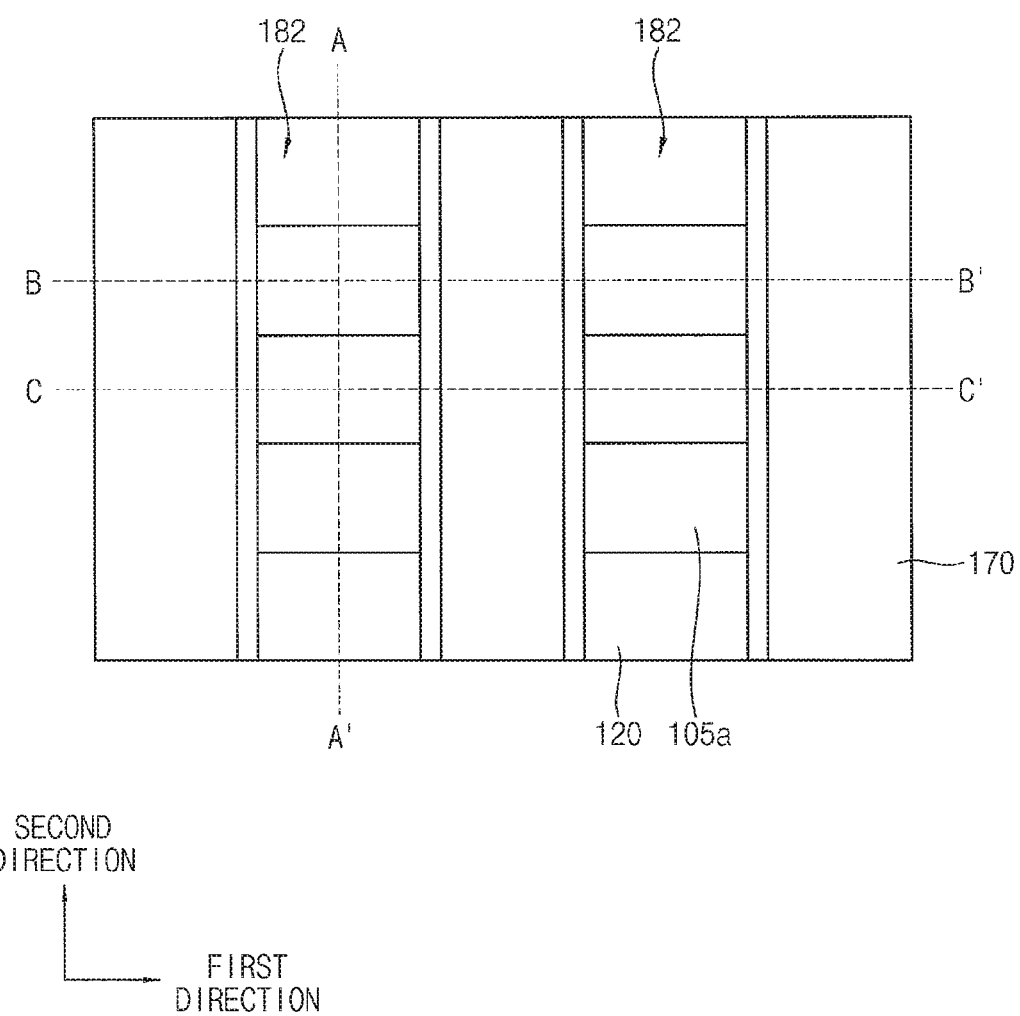
Figure 27:
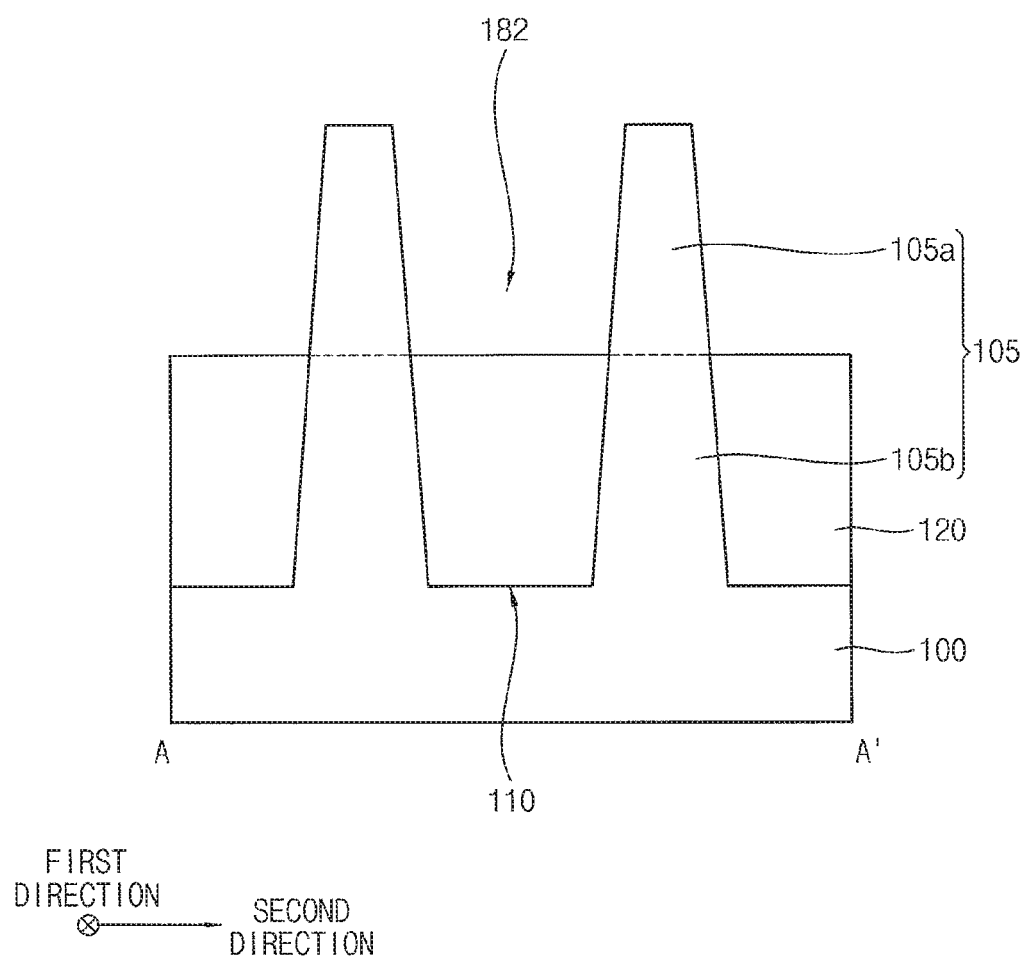
Figure 28:
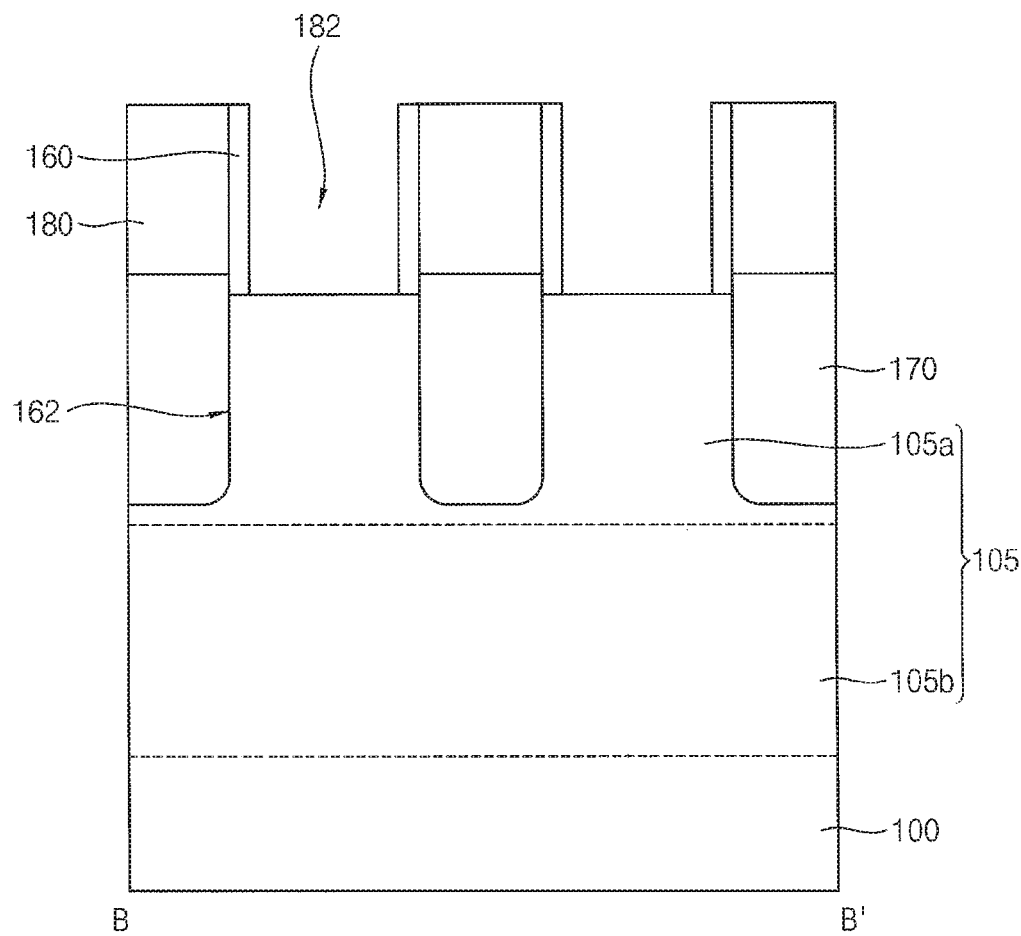
Figure 29:
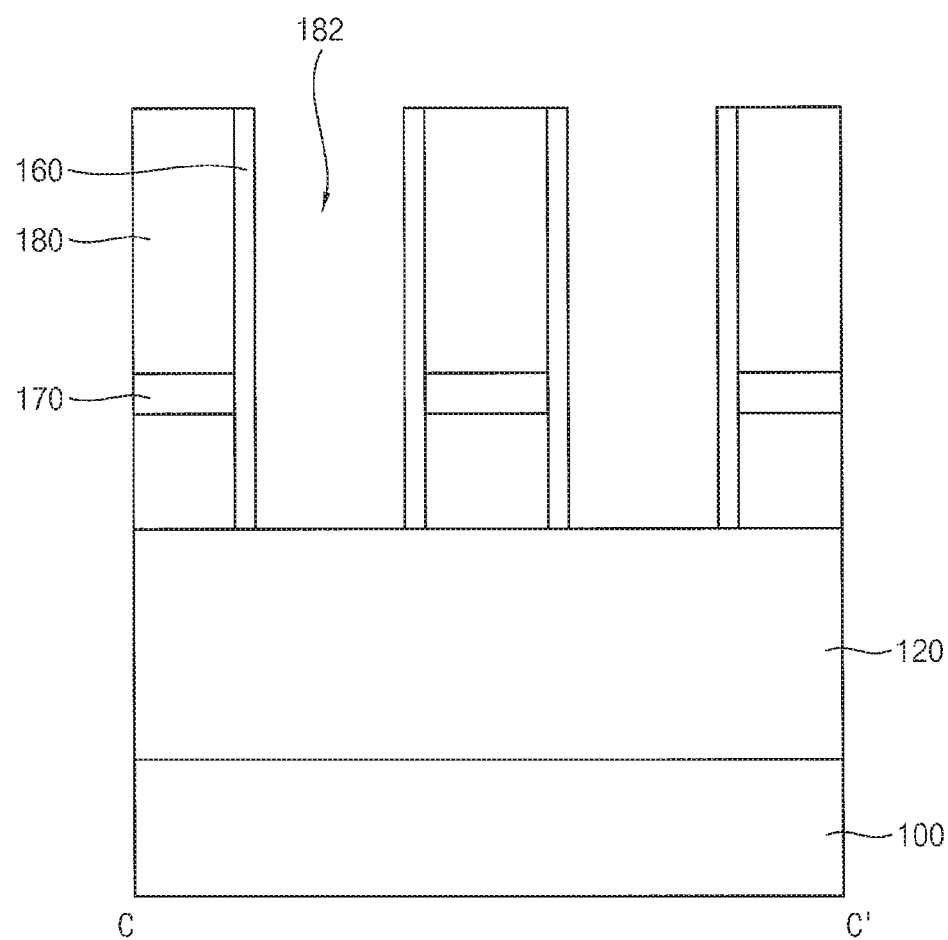

Referring to FIG. 25, a first insulating interlayer 180 may be formed on the dummy gate structure 152, the spacer structure 160, the epitaxial pattern 170 and the isolation pattern 120, and the first insulating interlayer 180 may be planarized until an upper surface of the second polysilicon pattern 142a of the dummy gate structure 152 is exposed.

The planarization process may include a chemical mechanical polishing (CMP) process and/or an etch back process. In the planarization process, the first hard mask 150 may be removed.

The first insulating interlayer 180 may be formed of silicon oxide. The first insulating interlayer 180 may be formed by a CVD process, an ALD process or a spin on glass (SOG) process.

Referring to FIGS. 26 to 29, the dummy gate structure 152 may be isotropically etched to form an opening 182 exposing a surface of the active fin 105.

When the etching process is performed, the spacer structures 160 on the sides of the dummy gate structures 152 may not be etched. The opening 182 may serve as a mold structure for forming a gate structure. Thus, a profile of the opening 182 or any layer delimiting the opening 182 may affect the forming of the gate structure.

As described above, the sides of the dummy gate structure 152 formed according to the inventive concept may be substantially the vertical. The opening 182 may be formed by removing the dummy gate structure 152, so that the sides of the opening 182 may also be substantially vertical.

The first polysilicon pattern 140b may have no void therein, so that materials of the spacer structure 160 may not become situated in the dummy gate structure 152. Accordingly, the materials of the spacer structure 160 may not project into the opening 182 so as to in effect define the profile of the opening 182. Thus, the gate structure may be normally formed by subsequent processes to fill the opening 182.

Figure 30:
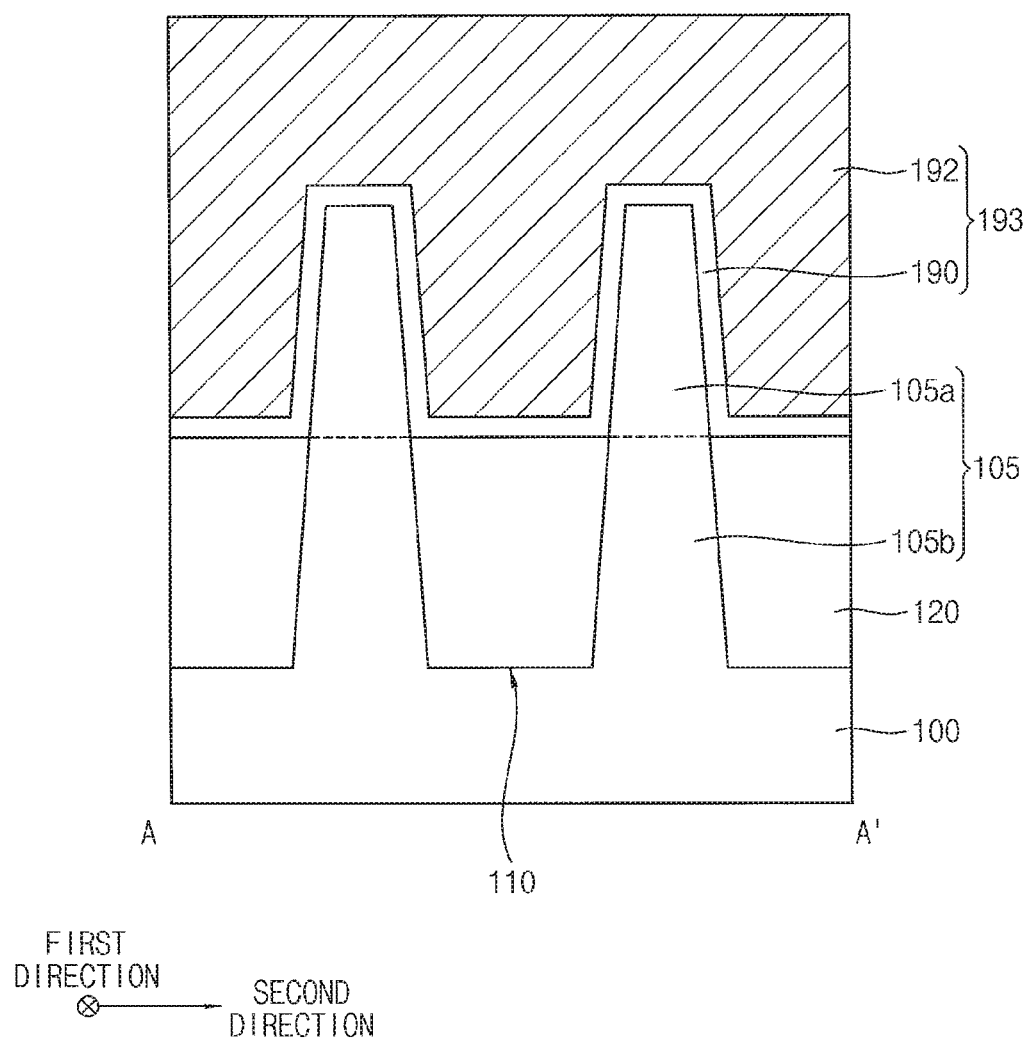
Figure 31:
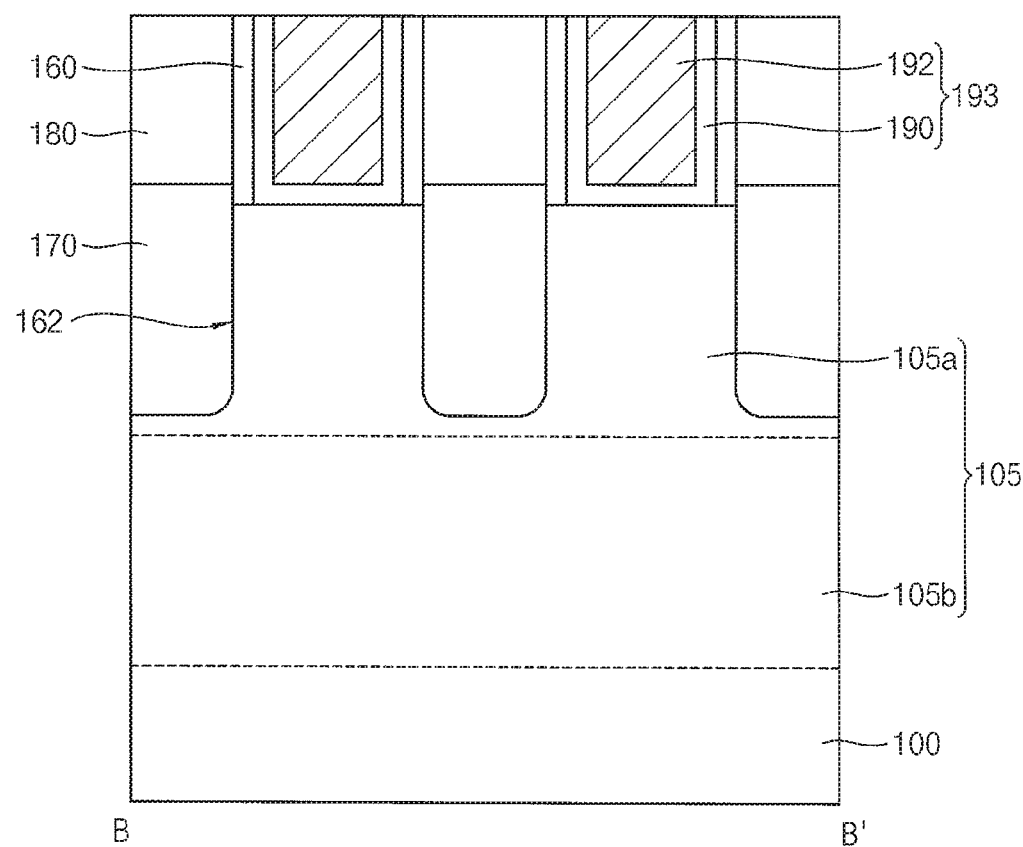
Figure 32:
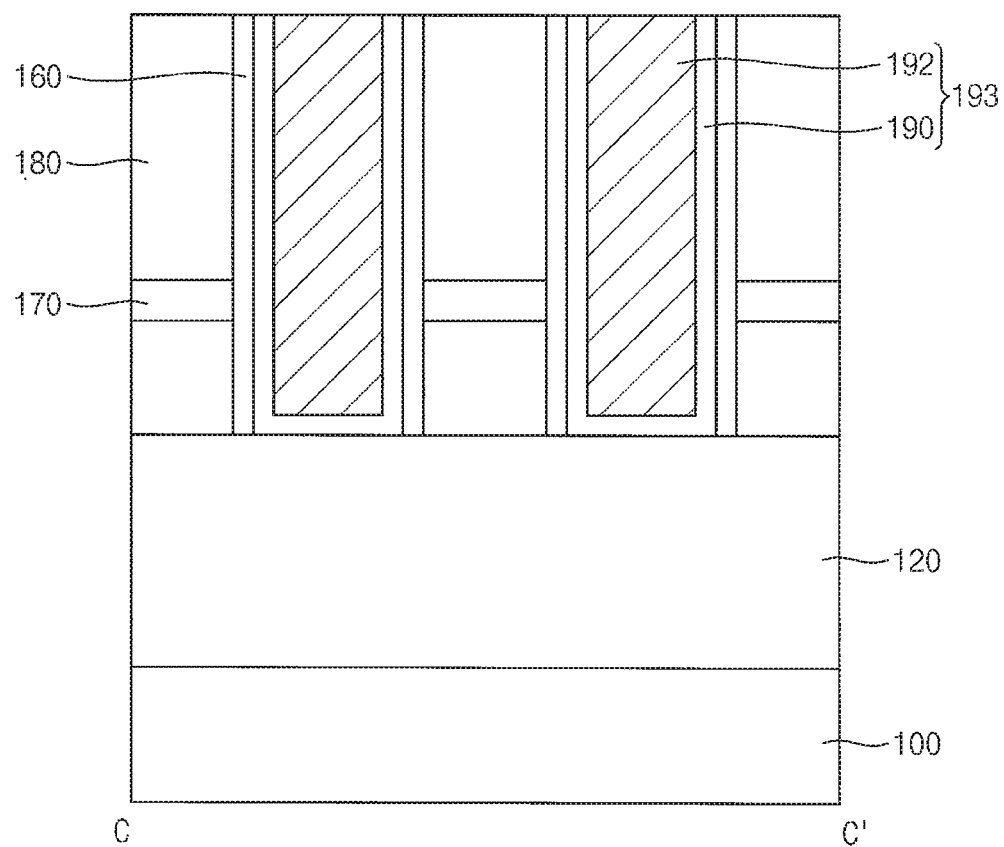
Figure 33:
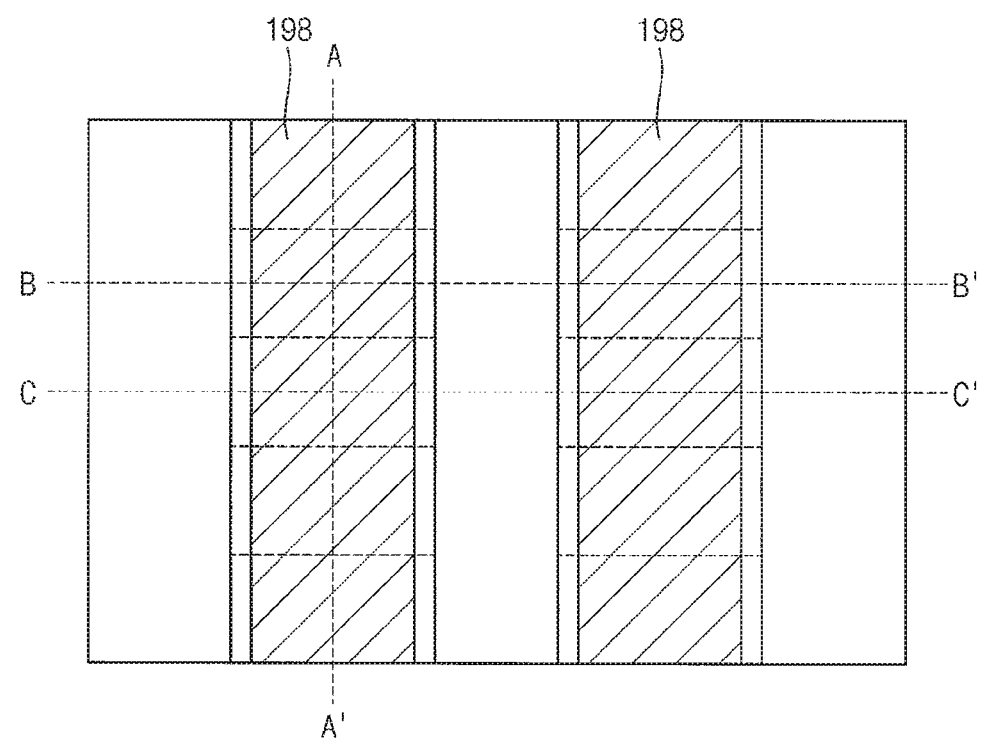

Referring to FIGS. 30 and 32, a preliminary gate structure 193 may be formed to fill the opening 182.

More specifically, an interface layer (not shown) may be formed by a thermal oxidation of the surface of the active fin 105 exposed by the opening 182. A gate insulation layer may be conformally formed on the interface layer, the isolation pattern 120, the spacer structures 160, and the first insulating interlayer 180. A gate electrode layer may be formed on the gate insulation layer to sufficiently fill a remaining portion of the opening 182, and may be planarized until an upper surface of the first insulating interlayer 180 is exposed. Thus, the preliminary gate structure 193 including a preliminary gate insulation pattern 190 and preliminary gate electrode 192 sequentially stacked may be formed.

The gate insulation layer may be formed of a metal oxide having a high dielectric constant, e.g., hafnium oxide, tantalum oxide, zirconium oxide, or the like, by a CVD process or an ALD process.

The gate electrode layer may be formed of a metal, e.g., aluminum, copper, or tantalum, or a metal nitride thereof, by a CVD process, an ALD process or a physical vapor deposition (PVD) process.

In examples of the inventive concept, a threshold voltage control layer (not shown) may be further formed at a stage in the process so as to be provided between the gate insulation layer and the gate electrode layer. The threshold voltage control layer may control a threshold voltage of the p-type finFET. In examples of the inventive concept, the threshold voltage control layer may be formed of a metal, a metal nitride or a metal alloy, e.g., titanium, titanium nitride, titanium aluminum nitride, tantalum nitride, or tantalum aluminum nitride, by a CVD process, an ALD process, a PVD process, or the like.

Figure 34:
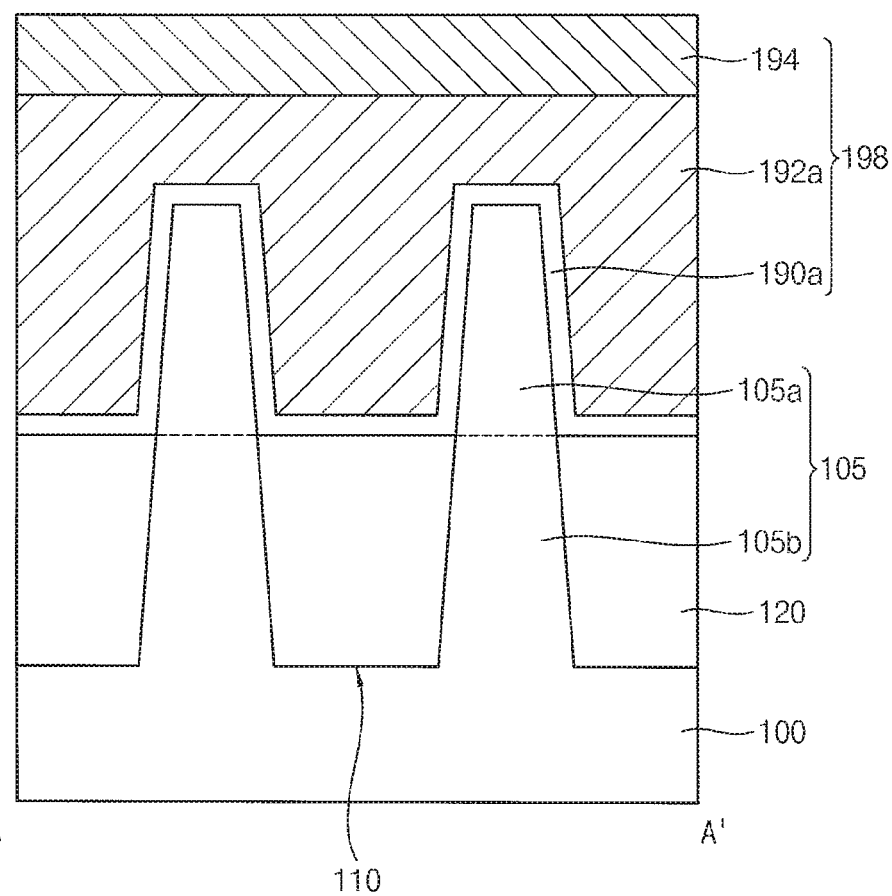
Figure 35:
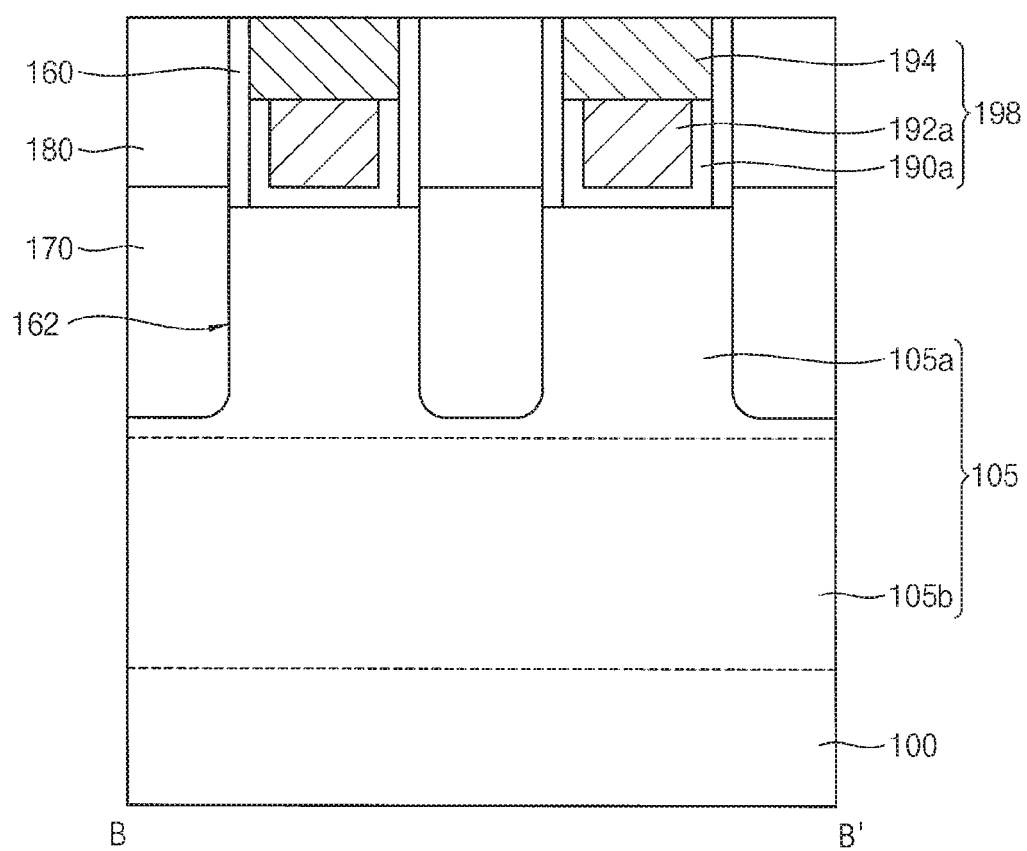
Figure 36:
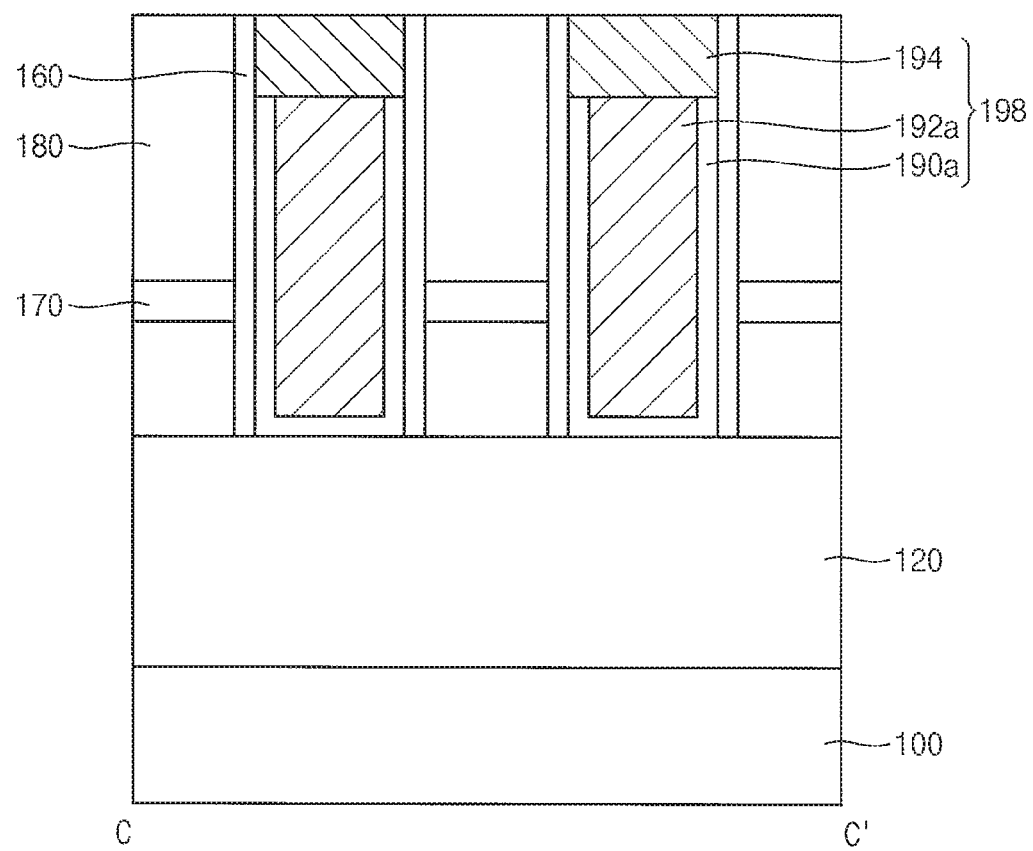
Figure 37:
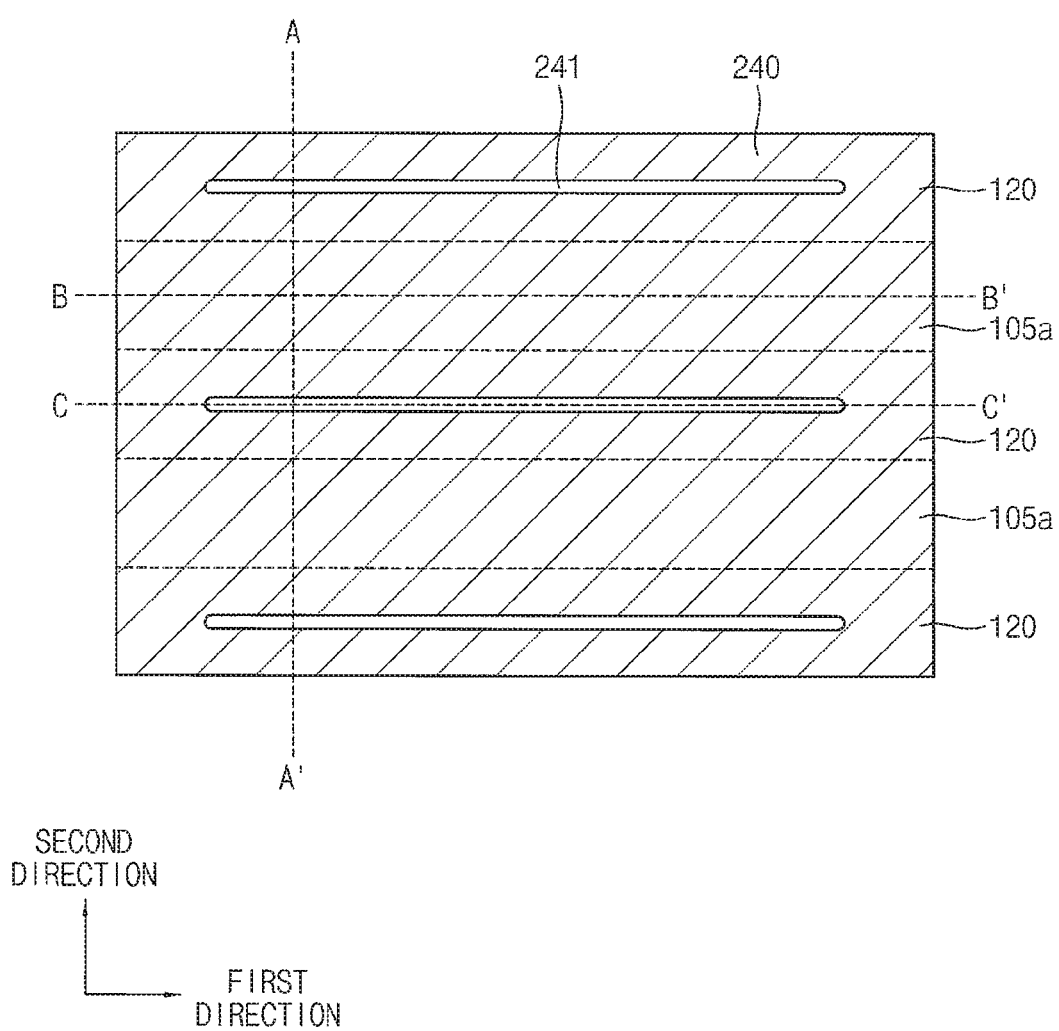
Figure 39:
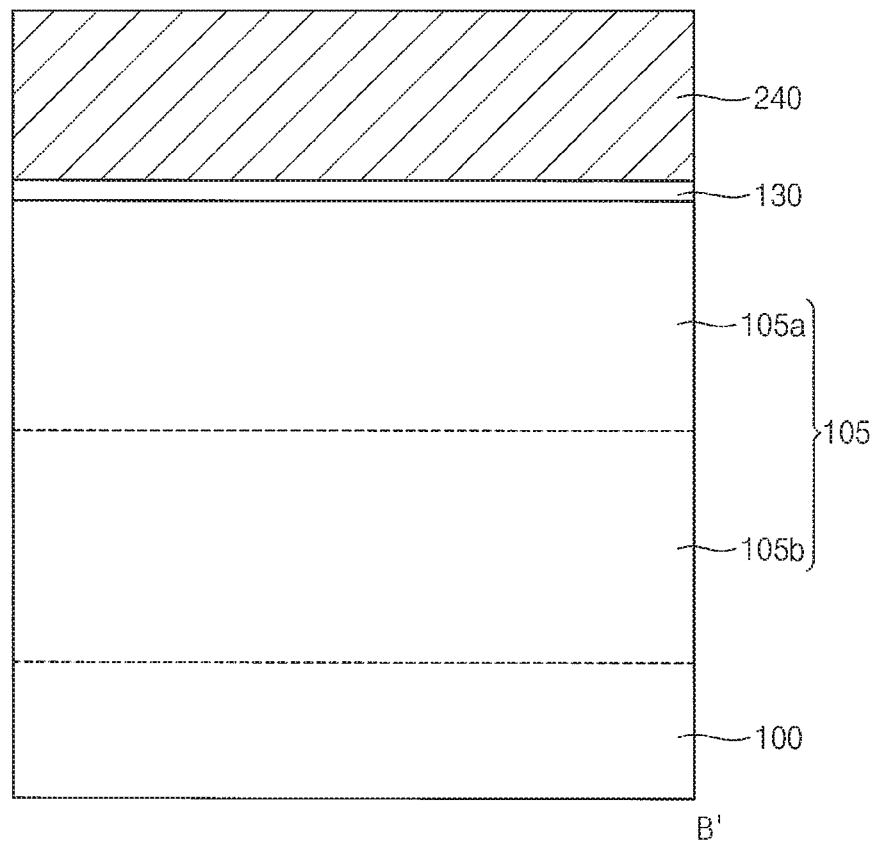
Figure 40:
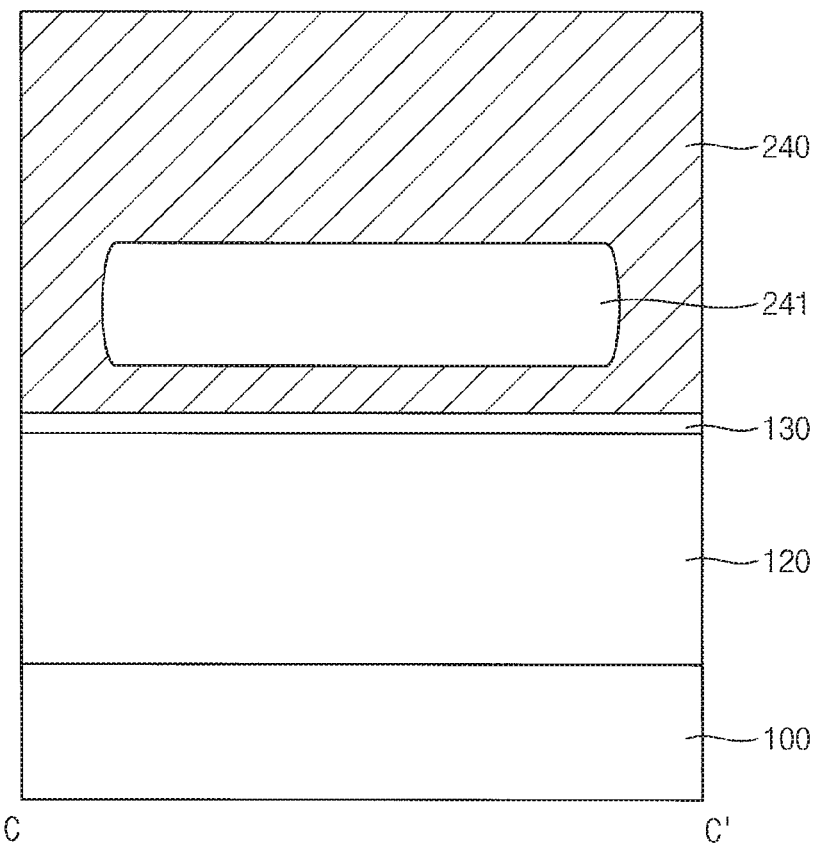

Referring to FIGS. 34 to 36, the preliminary gate insulation pattern 190 and preliminary gate electrode 192 may be partially etched to form a recess at an upper portion of the opening 182. A hard mask layer may be formed on the first insulating interlayer to fill the recess, and may be planarized until the upper surface of the first insulating interlayer 180 is exposed to form a second hard mask 194.

Thus, the gate structure 198 may be formed to fill the opening 182, and may include a gate insulation pattern 190a, a gate electrode 192a and the second hard mask 194 sequentially stacked. The hard mask layer may be formed of a nitride, e.g., silicon nitride.

Then, a second insulating interlayer (not shown) may be formed on the gate structure 198 and the first insulating interlayer 180. A first wiring structure may be further formed to be electrically connected to the epitaxial pattern 170 through the first and second insulating interlayers, and a second wiring structure may be further formed to be electrically connected to the gate electrode 192a through the second insulating interlayer and the second hard mask 194.

As described above, the void 141 in the first polysilicon layer 140a may be removed. Thus, an undercut is not be formed in the lower part of the side of the upper active pattern 105a, and the gate structure 198 may not have materials of the spacer structure 160 situated therein. Thus, a semiconductor device having good characteristics may be manufactured.

In the method of manufacturing the semiconductor device including the finFET, removal of a void in the first polysilicon layer has been described as illustrated in the figures. However, the process of removing the void according to the inventive concept may also be applied to other structures of a semiconductor device including transistors. That is, the process of removing a void may be used in any method of forming a gate structure including polysilicon or of forming a metal gate structure by a gate replacement process. Therefore, the inventive concept may be applied to a method of forming a planar type transistor, a recessed channel array transistor, a nonowire device, a nanobelt device, a nanosheet device, or III-V semiconductor device or a device including gate all around structure, for example.

FIGS. 37 to 43 illustrate essential stages in other examples of a method of manufacturing a semiconductor device in accordance with the inventive concept.

This method of manufacturing the semiconductor device may include processes substantially the same as those illustrated with reference to FIGS. 1 to 36, and so such processes will not be described again in detail hereinafter.

Referring to FIGS. 37 to 40, processes substantially the same as those shown in and described with reference to FIGS. 1 to 4 may be performed. Thus, the active fin 105 and the isolation pattern 120 may be formed on the substrate 100. The active fin 105 may include the lower active pattern 105b whose sides may be covered by the isolation pattern 120, and the upper active pattern 105a not covered by the isolation pattern 120 but protrude therefrom.

The dummy gate insulation layer 130 may be conformally formed on the upper active pattern 105a, and a preliminary polysilicon layer 240 may be formed on the dummy gate insulation layer 130 to fill each gap between adjacent ones of the upper active patterns 105a.

The preliminary polysilicon layer 240 may be formed on the dummy gate insulation layer 130. Thus, the preliminary polysilicon layer 240 may be formed to have a thickness substantially the same as or greater than about ½ of the first width, so that the gap between the upper active patterns 105a may be sufficiently filled.

The preliminary polysilicon layer 240 may serve as a mold layer for forming the gate structure. Thus, the preliminary polysilicon layer 240 may be formed to have a thickness substantially the same as a target thickness of the gate structure.

In examples of the inventive concept, the preliminary polysilicon layer 240 may be formed by a CVD process or an ALD process. The preliminary polysilicon layer 240 may be formed at a temperature of about 300° C. to about 700° C.

The preliminary polysilicon layer 240 filling a gap between upper active patterns 105a may include a void 241 therein.

Figure 41:
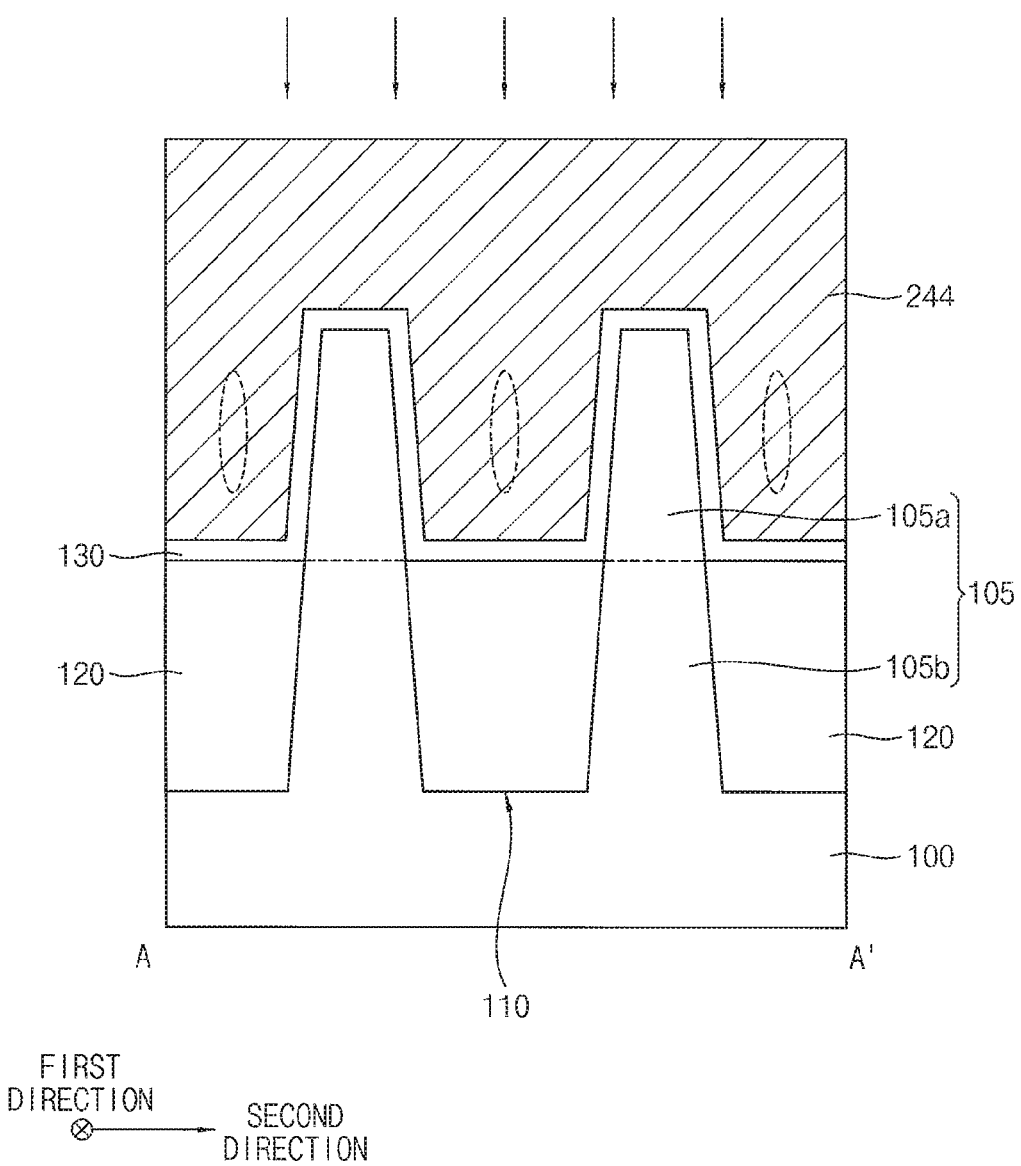
Figure 42:
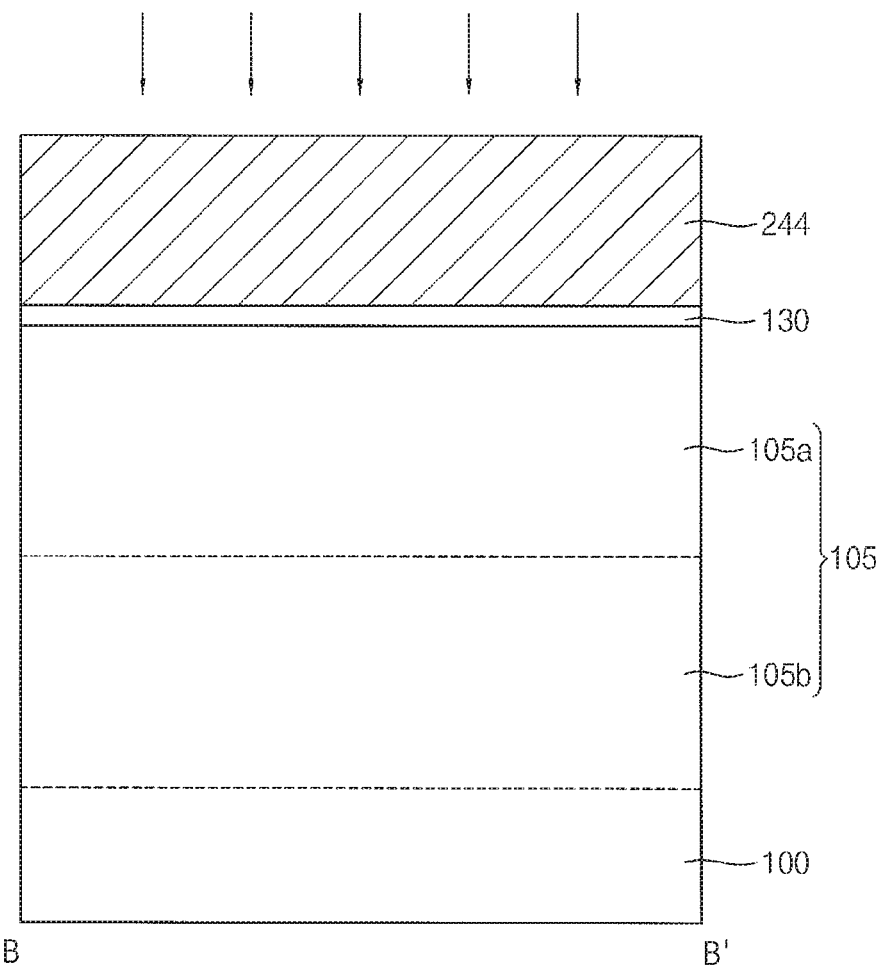
Figure 43:
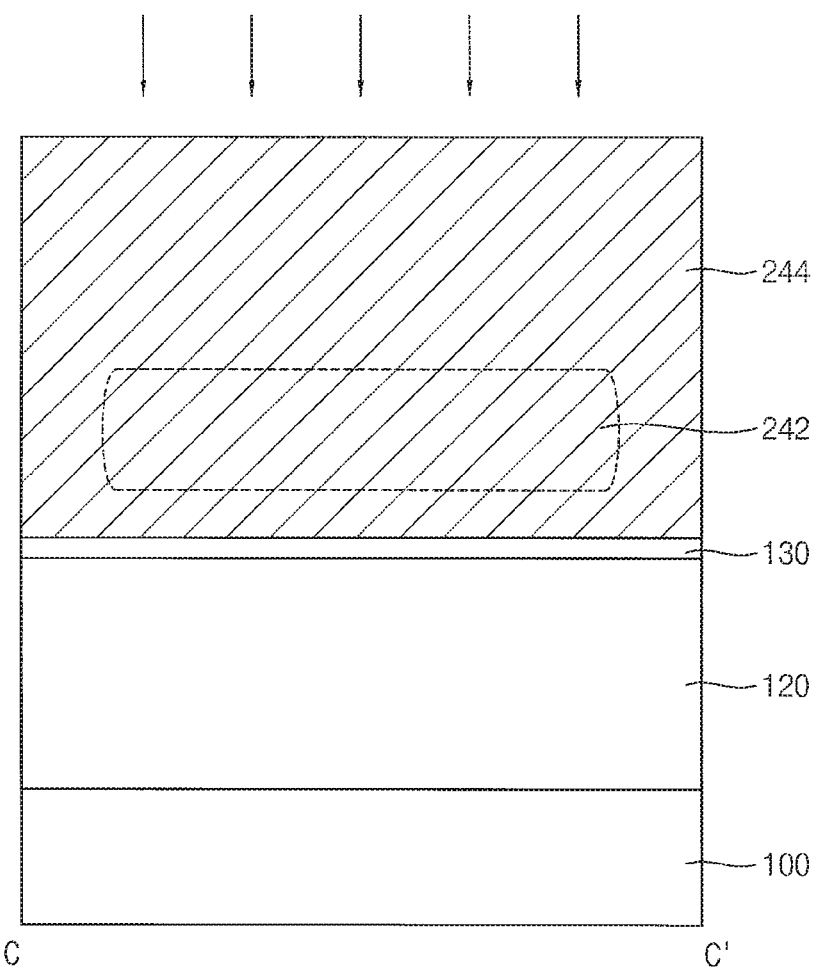

Referring to FIGS. 41 to 43, the preliminary polysilicon layer 240 may be doped with electrically neutral dopant by an ion implantation process to form a polysilicon layer 244 having no void. During the ion implantation process, the active fin 105 may maintain single crystallinity, and may not assume an amorphous state.

The ion implantation process may be substantially the same as that shown in and described with reference to FIGS. 9 to 11.

The first hard mask may be formed on the polysilicon layer 244. The polysilicon layer 244 and the dummy gate insulation layer 130 may be patterned using the first hard mask as an etching mask to form the dummy gate structure.

That is, after forming the polysilicon layer, a second polysilicon layer may not be formed on the polysilicon layer, and processes substantially the same as those shown in and described with reference to FIGS. 16 to 19 may be performed to form the dummy gate structure.

Then, processes substantially the same as those shown in and described with reference to FIGS. 20 to 36 may be performed to form the semiconductor device shown in FIG. 36.

The above method of manufacturing the semiconductor device may be applied to methods of manufacturing various types of memory devices or logic devices including transistors.

The foregoing is illustrative of examples of the inventive concept and is not to be construed as limiting thereof. Although several examples of the inventive concept have been described, those skilled in the art will readily appreciate that many modifications are possible in the examples of the inventive concept without materially departing from the novel teachings and advantages of the present inventive concept. Accordingly, all such modifications are intended to be included within the scope of the present inventive concept as defined in the claims.

What is claimed is:

1. A method of manufacturing a semiconductor device, the method comprising:
   forming an isolation pattern on a substrate to define a plurality of active patterns of crystalline material, the active patterns protruding from the isolation pattern and spaced from one another such that a gap exists between adjacent ones of the active patterns;
   forming a preliminary polysilicon layer on the active patterns to fill the gap;
   ion implanting using electrically neutral dopants, the dopants implanting into the preliminary polysilicon layer to form a polysilicon layer having no void therein, wherein crystallinity of the active patterns is maintained during the ion implanting;
   patterning the polysilicon layer to form a dummy gate structure on the active patterns; and
   forming a source/drain region at upper portions of the active patterns adjacent to sides of the dummy gate structure.

2. The method of claim 1, wherein the ion implanting is performed at a temperature of about 100° C. to about 700° C.

3. The method of claim 1, wherein the ion implanting is performed with an ion implantation energy of about 10 keV to about 50 keV.

4. The method of claim 1, when the ion implanting is performed with a dose of about $1E13/cm^2$ to about $1E16/cm^2$.

5. The method of claim 1, wherein the dopants include silicon, carbon and/or germanium.

6. The method of claim 1, wherein the preliminary polysilicon layer is formed to have a thickness substantially equal to or greater than ½ of a first width of the gap between adjacent ones of the active patterns.

7. The method of claim 1, further comprising, after forming the first polysilicon layer:
   forming a second polysilicon layer on the first polysilicon layer.

8. The method of claim 1, further comprising, after forming the first polysilicon layer:
   replacing the dummy gate structure with a gate structure.

9. The method of claim 1, further comprising forming a spacer on the sides of the dummy gate structure.

10. A method of manufacturing a semiconductor device, the method comprising:
    forming an isolation pattern on a substrate to define a plurality of active patterns of crystalline material, the active patterns protruding from the isolation pattern and spaced from one another such that a gap exists between adjacent ones of the active patterns;
    forming a preliminary polysilicon layer on the active patterns to fill the gap;
    ion implanting using ions electrically neutral dopants, the dopants implanting into the preliminary polysilicon layer to form a polysilicon layer having no void therein, wherein crystallinity of the active patterns is maintained during the ion implanting;
    patterning the polysilicon layer to form a dummy gate structure on the active patterns;
    forming a source/drain region at upper portions of the active patterns adjacent to sides of the dummy gate structure;
    removing the dummy gate structure to form an opening; and
    forming a gate structure in the opening.

11. The method of claim 10, wherein the ion implanting is performed at a temperature of about 100° C. to about 700° C.

12. The method of claim 10, wherein the dopants include silicon, carbon and/or germanium.

13. The method of claim 10, further comprising, after forming the first polysilicon layer:
    forming a second polysilicon layer on the first polysilicon layer.

14. The method of claim 10, further comprising forming a spacer on the sides of the dummy gate structure.

15. The method of claim 10, wherein the gate structure includes a gate insulation pattern, a gate electrode and a hard mask sequentially stacked, and wherein the gate electrode includes a metal.

16. A method of manufacturing a semiconductor device, the method comprising:
    forming active patterns of crystalline material each extending longitudinally in a first direction and spaced apart from each other in a second direction such that a gap is defined by and between respective ones of the active patterns adjacent to each other in the second direction;
    depositing polysilicon on the active patterns conformally until the polysilicon within the gap has an upper surface situated above the level of upper surfaces of the active regions;
    implanting an electrically neutral dopant into the polysilicon to form a consolidated layer comprising polysilicon and under such conditions that the active patterns remain crystalline during the implanting of the dopant;
    forming a gate extending across the active patterns, wherein the forming of the gate includes patterning the consolidated layer comprising polysilicon; and
    forming a source/drain region at upper portions of the active patterns.

17. The method of claim 16, wherein the dopant consists of atoms of at least one element selected from the group consisting of silicon, carbon and germanium.

18. The method of claim 16, wherein the implanting of the dopant is performed at a temperature in a range of 100° C. to 700° C.

19. The method of claim 16, wherein implanting of the dopant is performed with an implantation energy in a range of 10 keV to 50 keV.

20. The method of claim 16, when the dopant is implanted at a dose in a range of $1E13/cm^2$ to $1E16/cm^2$.

* * * * *